United States Patent
Takasawa et al.

(10) Patent No.: US 9,443,720 B2
(45) Date of Patent: *Sep. 13, 2016

(54) METHOD OF MANUFACTURING SEMICONDUCTOR DEVICE FOR FORMING FILM INCLUDING AT LEAST TWO DIFFERENT ELEMENTS

(71) Applicant: Hitachi-Kokusai Electric Inc., Tokyo (JP)

(72) Inventors: Yushin Takasawa, Toyama (JP); Hajime Karasawa, Toyama (JP); Yoshiro Hirose, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/082,167

(22) Filed: Mar. 28, 2016

(65) Prior Publication Data

US 2016/0211134 A1 Jul. 21, 2016

Related U.S. Application Data

(63) Continuation of application No. 14/676,115, filed on Apr. 1, 2015, now Pat. No. 9,384,966, which is a continuation of application No. 12/625,712, filed on Nov. 25, 2009, now Pat. No. 9,318,316.

(30) Foreign Application Priority Data

Nov. 26, 2008 (JP) ................................ 2008-300891
Oct. 27, 2009 (JP) ................................ 2009-246707

(51) Int. Cl.
*H01L 21/02* (2006.01)

(52) U.S. Cl.
CPC ..... *H01L 21/0228* (2013.01); *H01L 21/02123* (2013.01)

(58) Field of Classification Search
None
See application file for complete search history.

(56) References Cited

U.S. PATENT DOCUMENTS

| 4,058,430 A | 11/1977 | Suntola et al. |
| 4,720,395 A | 1/1988 | Foster |
| 5,296,258 A | 3/1994 | Tay et al. |

(Continued)

FOREIGN PATENT DOCUMENTS

| JP | 61043413 | 3/1986 |
| JP | 2004158481 | 6/2004 |

(Continued)

OTHER PUBLICATIONS

Office Action, U.S. Appl. No. 15/082,145, dated May 27, 2016.

*Primary Examiner* — Scott B Geyer
(74) *Attorney, Agent, or Firm* — Brundidge & Stanger, P.C.

(57) ABSTRACT

Provided is a technique of forming a film on a substrate by performing a cycle a predetermined number of times. The cycle includes: forming a first layer by supplying a gas containing a first element to the substrate, wherein the first layer is a discontinuous layer, a continuous layer, or a layer in which at least one of the discontinuous layer or the continuous layer is overlapped; forming a second layer including the first layer and a discontinuous layer including a second element stacked on the first layer; and forming a third layer by supplying a gas containing a third element to the substrate to modify the second layer under a condition where a modifying reaction of the second layer by the gas containing the third element is not saturated.

18 Claims, 13 Drawing Sheets

(56) References Cited

U.S. PATENT DOCUMENTS

| | | |
|---|---|---|
| 6,566,147 B2 | 5/2003 | Basceri |
| 6,586,349 B1 | 7/2003 | Jeon et al. |
| 6,913,996 B2 | 7/2005 | Yamasaki |
| 7,294,582 B2 | 11/2007 | Haverkort et al. |
| 7,432,548 B2 | 10/2008 | Forbes et al. |
| 7,608,549 B2 | 10/2009 | Van Nooten |
| 7,713,868 B2 | 5/2010 | Clark |
| 7,884,034 B2 | 2/2011 | Hirose |
| 8,158,216 B2 | 4/2012 | Thomas |
| 9,318,316 B2 * | 4/2016 | Takasawa ............ H01L 21/022 |
| 2003/0234417 A1 | 12/2003 | Raaijmakers |
| 2004/0087143 A1 | 5/2004 | Norman |
| 2004/0142557 A1 | 7/2004 | Levy |
| 2004/0234704 A1 | 11/2004 | Garg et al. |
| 2006/0014384 A1 | 1/2006 | Lee et al. |
| 2006/0032443 A1 | 2/2006 | Hasebe et al. |
| 2006/0199357 A1 | 9/2006 | Wan et al. |
| 2006/0208215 A1 | 9/2006 | Metzner et al. |
| 2007/0042577 A1 | 2/2007 | Ishizaka |
| 2007/0061006 A1 | 3/2007 | Desatnik et al. |
| 2007/0082492 A1 | 4/2007 | Kim et al. |
| 2007/0148933 A1 | 6/2007 | Lee et al. |
| 2007/0181931 A1 | 8/2007 | Ahn et al. |
| 2009/0101919 A1 | 4/2009 | Yao |
| 2009/0142491 A1 | 6/2009 | Nakamura et al. |
| 2010/0124618 A1 | 5/2010 | Kobayashi et al. |
| 2010/0130024 A1 | 5/2010 | Takasawa et al. |
| 2011/0169049 A1 | 7/2011 | Loo |
| 2015/0206737 A1 | 7/2015 | Takasawa |
| 2015/0206742 A1 | 7/2015 | Takasawa |
| 2015/0214024 A1 | 7/2015 | Takasawa |
| 2015/0214031 A1 | 7/2015 | Takasawa |
| 2015/0214032 A1 | 7/2015 | Takasawa |
| 2015/0214033 A1 | 7/2015 | Takasawa |
| 2015/0214034 A1 | 7/2015 | Takasawa |
| 2015/0221495 A1 | 8/2015 | Takasawa |
| 2015/0371843 A1 | 12/2015 | Takasawa et al. |

FOREIGN PATENT DOCUMENTS

| | | |
|---|---|---|
| JP | 2004288703 | 10/2004 |
| JP | 2006524434 A | 10/2006 |
| JP | 2007-48926 | 2/2007 |
| JP | 2007043147 | 2/2007 |
| JP | 2007-81427 | 3/2007 |
| JP | 2007067412 | 3/2007 |
| JP | 2007281181 | 10/2007 |
| JP | 2008-502805 | 1/2008 |
| JP | 2008060455 A | 3/2008 |
| JP | 2008-227460 | 9/2008 |
| KR | 1019980063881 | 10/1998 |
| KR | 1020060097619 | 9/2006 |
| WO | 2005/124849 | 12/2005 |

* cited by examiner

METHOD OF MANUFACTURING SEMICONDUCTOR DEVICE FOR FORMING FILM INCLUDING AT LEAST TWO DIFFERENT ELEMENTS

CROSS-REFERENCE TO RELATED PATENT APPLICATION

This application is a continuation of U.S. patent application Ser. No. 14/676,115, filed Apr. 1, 2015, which is a continuation of U.S. patent application Ser. No. 12/625,712, filed Nov. 25, 2009, which claims the benefit of priority of Japanese Patent Application No. 2008-300891, filed Nov. 26, 2008 and Japanese Patent Application No. 2009-246707, filed Oct. 27, 2009, the entire contents of which are hereby incorporated by reference.

BACKGROUND OF THE INVENTION

1. Field of the Invention

The present invention relates to a semiconductor device manufacturing method including a process of forming a thin film on a substrate, and a substrate processing apparatus.

2. Description of the Prior Art

Among semiconductor device manufacturing processes, there is a process of forming an insulating film such as silicon oxide ($SiO_2$) film or silicon nitride ($Si_3N_4$) film. Since silicon oxide films have good properties such as excellent insulation properties and low dielectric constant, silicon oxide films are widely used as insulating films or interlayer films. In addition, since silicon nitride films have good properties such as excellent insulation properties, corrosion resistance, dielectric constant, and film stress controllability, silicon nitride films are widely used as insulating films, mask films, charge storage films, and stress control films. As a method of forming such a film, a chemical vapor deposition (CVD) method or an atomic layer deposition (ALD) is used.

In recent years, as a result of scaling down of semiconductor devices or low-temperature substrate processing processes, either in the case where the quality of films remains at the conventional level or in the case where the quality of films is degraded due to low-temperature processing, it is difficult to ensure the performance of semiconductor devices. Although new kinds of films are being developed to ensure the performance of semiconductor devices, due to tasks (such as costs and affections on another process) caused by the development of new kinds of films, the case of achieving desired performance levels by improving existing films is more preferable.

SUMMARY OF THE INVENTION

An object of the present invention is to provide a technique to modify a conventional film so as to improve the quality of the film for achieving a desired performance level.

According to an aspect of the present invention, there is provided a technique including forming a film on a substrate, the film including a first element, a second element different from the first element, and a third element different from the first element and the second element, by performing a cycle a predetermined number of times, the cycle including:

(a) forming a first layer including the first element by supplying a gas containing the first element to the substrate, wherein the first layer is a discontinuous layer, a continuous layer, or a layer in which at least one of the discontinuous layer or the continuous layer is overlapped;

(b) forming a second layer including the first layer and a discontinuous layer including the second element stacked on the first layer, wherein the discontinuous layer including the second element is formed by supplying a gas containing the second element to the substrate; and (c) forming a third layer including the first element, the second element and the third element by supplying a gas containing the third element to the substrate to modify the second layer under a condition where a modifying reaction of the second layer by the gas containing the third element is not saturated.

DETAILED DESCRIPTION OF THE PREFERRED EMBODIMENTS

Embodiments of the present invention will be described hereinafter with reference to the attached drawings.

Figure 1:
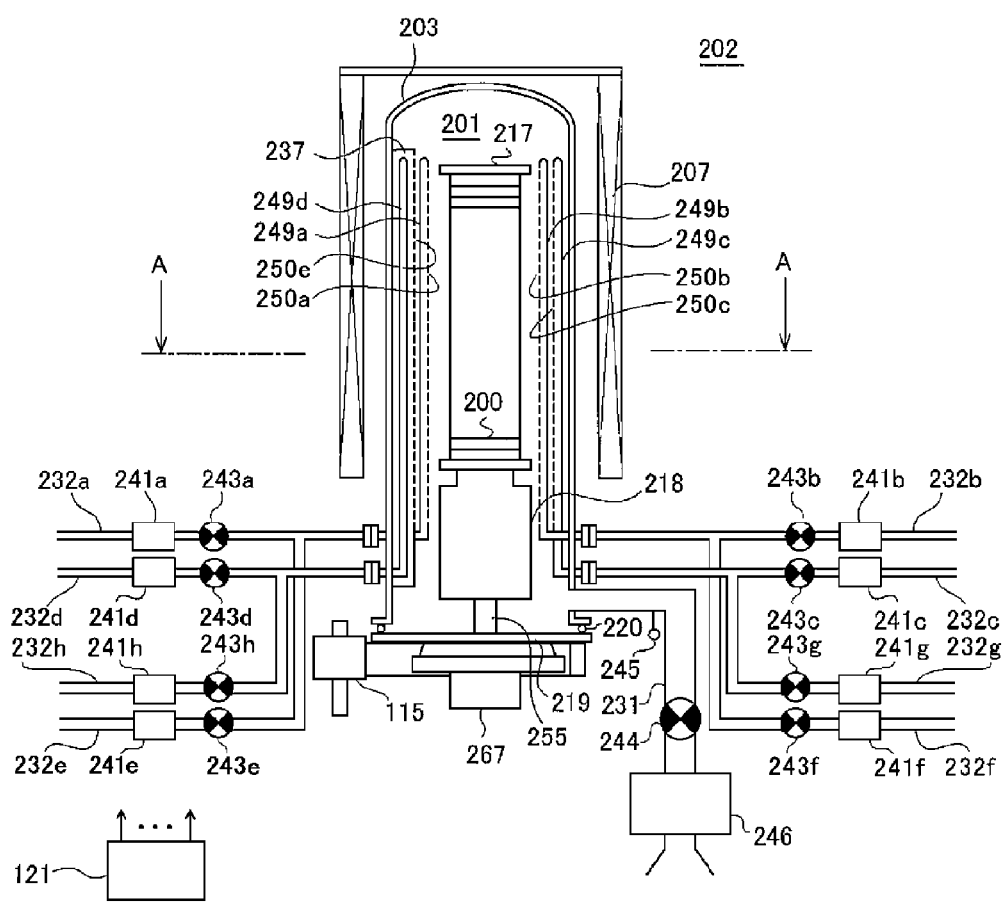
FIG. 1 is a vertical sectional view schematically illustrating a vertical process furnace of a substrate processing apparatus according to a preferred embodiment of the present invention.
Figure 2:
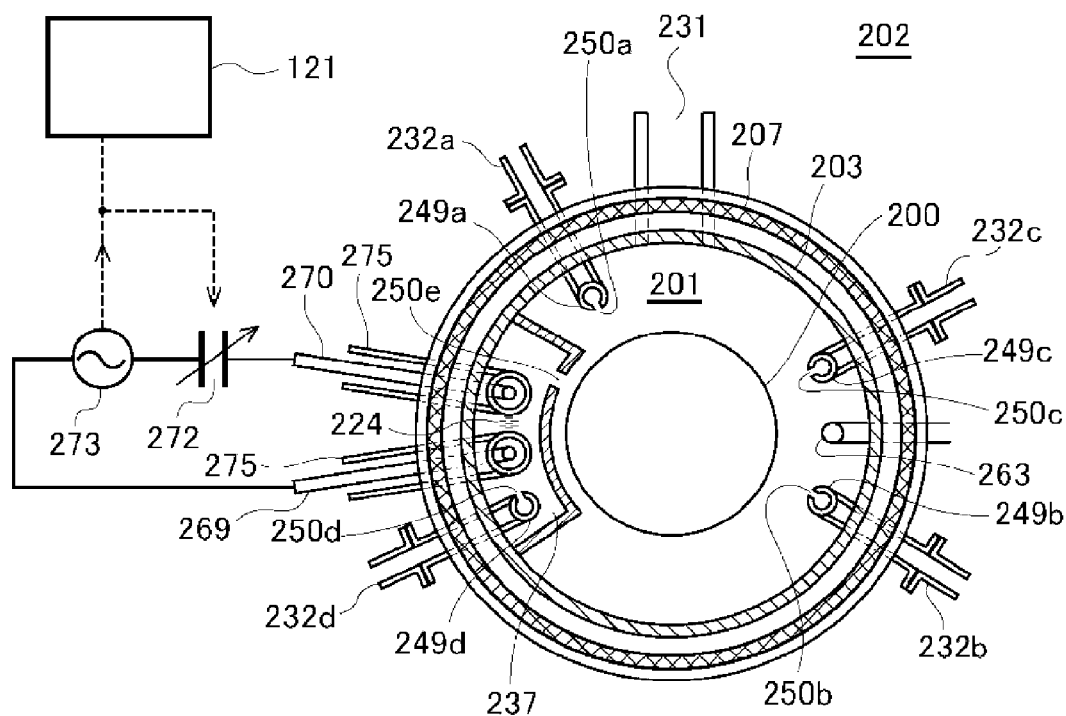
FIG. 2 is a sectional view taken along line A-A of FIG. 1 for schematically illustrating the vertical process furnace according to a preferred embodiment of the present invention.

FIG. 1 is a vertical sectional view schematically illustrating a vertical process furnace 202 of a substrate processing apparatus according to a preferred embodiment of the present invention, and FIG. 2 is a sectional view taken along line A-A of FIG. 1 for schematically illustrating the vertical process furnace 202 according to a preferred embodiment of the present invention.

As shown in FIG. 1, the process furnace 202 includes a heater 207 used as a heating unit (heating mechanism). The heater 207 has a cylindrical shape and is vertically installed in a state where the heater 207 is supported on a heater base (not shown) which is a holding plate. As described later, the heater 207 is also used as an activation mechanism for activating gas by heat.

Inside the heater 207, a reaction tube 203 constituting a reaction vessel (process vessel) is installed concentrically with the heater 207. The reaction tube 203 is made of a heat-resistant material such as a quartz ($SiO_2$) or silicon carbide (SiC) and has a cylindrical shape with a closed top side and an opened bottom side. The hollow part of the reaction tube 203 forms a process chamber 201 and is configured to accommodate substrates such as wafers 200 by using a boat 217 (described later) in a manner such that the wafers 200 are horizontally positioned and vertically arranged in multiple stages.

At the lower part of the reaction tube 203 in the process chamber 201, a first nozzle 249a, a second nozzle 249b, a third nozzle 249c, and a fourth nozzle 249d are installed through the reaction tube 203. A first gas supply pipe 232a, a second gas supply pipe 232b, a third gas supply pipe 232c, and a fourth gas supply pipe 232d are connected to the first nozzle 249a, the second nozzle 249b, the third nozzle 249c, and the fourth nozzle 249d, respectively. In this way, at the reaction tube 203, four nozzles 249a, 249b, 249c, and 249d, and four gas supply pipes 232a, 232b, 232c, and 232d are installed, and it is configured such that a plurality of kinds of gases, here, four kinds of gases, can be supplied to the reaction tube 203.

At the first gas supply pipe 232a, a flowrate controller (flowrate control unit) such as a mass flow controller (MFC) 241a, and an on-off valve such as a valve 243a are sequentially installed from the upstream side of the first gas supply pipe 232a. In addition, a first inert gas supply pipe 232e is connected to the downstream side of the valve 243a of the first gas supply pipe 232a. At the first inert gas supply pipe 232e, a flowrate controller (flowrate control unit) such as an MFC 241e, and an on-off valve such as a valve 243e are sequentially installed from the upstream side of the first inert gas supply pipe 232e. In addition, the first nozzle 249a is connected to the leading end of the first gas supply pipe 232a. In an arc-shaped space between the inner wall of the reaction tube 203 and wafers 200, the first nozzle 249a is erected in a manner such that the first nozzle 249a extends upward from the lower side to the upper side along the inner wall of the reaction tube 203 in a direction in which the wafers 200 are stacked. The first nozzle 249a is an L-shaped long nozzle. Gas supply holes 250a are formed through the lateral surface of the first nozzle 249a. The gas supply holes 250a are opened toward the centerline of the reaction tube 203. The gas supply holes 250a are formed at a plurality of positions along the lower side to the upper side of the reaction tube 203, and the gas supply holes 250a have the same size and are arranged at the same pitch. A first gas supply system is constituted mainly by the first gas supply pipe 232a, the MFC 241a, the valve 243a, and the first nozzle 249a. In addition, a first inert gas supply system is constituted mainly by the first inert gas supply pipe 232e, the MFC 241e, and the valve 243e.

At the second gas supply pipe 232b, a flowrate controller (flowrate control unit) such as a mass flow controller (MFC) 241b, and an on-off valve such as a valve 243b are sequentially installed from the upstream side of the second gas supply pipe 232b. In addition, a second inert gas supply pipe 232f is connected to the downstream side of the valve 243b of the second gas supply pipe 232b. At the second inert gas supply pipe 232f, a flowrate controller (flowrate control unit) such as an MFC 241f, and an on-off valve such as a valve 243f are sequentially installed from the upstream side of the second inert gas supply pipe 232e. In addition, the second nozzle 249b is connected to the leading end of the second gas supply pipe 232b. In an arc-shaped space between the inner wall of the reaction tube 203 and wafers 200, the second nozzle 249b is erected in a manner such that the second nozzle 249b extends upward from the lower side to the upper side along the inner wall of the reaction tube 203 in a direction in which the wafers 200 are stacked. The second nozzle 249b is an L-shaped long nozzle. Gas supply holes 250b are formed through the lateral surface of the second nozzle 249a. The gas supply holes 250b are opened toward the centerline of the reaction tube 203. The gas supply holes 250b are formed at a plurality of positions along the lower side to the upper side of the reaction tube 203, and the gas supply holes 250b have the same size and are arranged at the same pitch. A second gas supply system is constituted mainly by the second gas supply pipe 232b, the MFC 241b, the valve 243b, and the second nozzle 249b. In addition, a second inert gas supply system is constituted mainly by the second inert gas supply pipe 232f, the MFC 241f, and the valve 243f.

At the third gas supply pipe 232c, a flowrate controller (flowrate control unit) such as a mass flow controller (MFC) 241c, and an on-off valve such as a valve 243c are sequentially installed from the upstream side of the third gas supply pipe 232c. In addition, a third inert gas supply pipe 232g is connected to the downstream side of the valve 243c of the third gas supply pipe 232c. At the third inert gas supply pipe 232g, a flowrate controller (flowrate control unit) such as an MFC 241g, and an on-off valve such as a valve 243g are sequentially installed from the upstream side of the third inert gas supply pipe 232g. In addition, the third nozzle 249c is connected to the leading end of the third gas supply pipe 232c. In an arc-shaped space between the inner wall of the reaction tube 203 and wafers 200, the third nozzle 249c is erected in a manner such that the third nozzle 249c extends upward from the lower side to the upper side along the inner wall of the reaction tube 203 in a direction in which the wafers 200 are stacked. The third nozzle 249c is an L-shaped long nozzle. Gas supply holes 250c are formed through the lateral surface of the third nozzle 249c. The gas supply holes 250c are opened toward the centerline of the reaction tube 203. The gas supply holes 250c are formed at a plurality of positions along the lower side to the upper side of the reaction tube 203, and the gas supply holes 250c have the same size and are arranged at the same pitch. A third gas supply system is constituted mainly by the third gas supply pipe 232c, the MFC 241c, the valve 243c, and the third nozzle 249c. In addition, a third inert gas supply system is constituted mainly by the third inert gas supply pipe 232g, the MFC 241g, and the valve 243g.

At the fourth gas supply pipe 232d, a flowrate controller (flowrate control unit) such as an MFC 241d, and an on-off valve such as a valve 243d are sequentially installed from the upstream side of the fourth gas supply pipe 232d. In addition, a fourth inert gas supply pipe 232h is connected to the downstream side of the valve 243d of the fourth gas supply pipe 232d. At the fourth inert gas supply pipe 232h, a flowrate controller (flowrate control unit) such as an MFC 241h, and an on-off valve such as a valve 243h are sequentially installed from the upstream side of the fourth inert gas supply pipe 232h. The fourth nozzle 249d is connected to the leading end of the fourth gas supply pipe 232d. The fourth nozzle 249d is installed in a buffer chamber 237 forming a gas diffusion space.

The buffer chamber 237 is installed in an arc-shaped space between the reaction tube 203 and wafers 200 in a manner such that the buffer chamber 237 is located from the lower side to the upper side of the inner wall of the reaction tube 203 in a direction in which the wafers 200 are stacked. At an end of a wall of the buffer chamber 237 adjacent to the wafers 200, gas supply holes 250e are formed to supply gas therethrough. The gas supply holes 250e are opened toward the centerline of the reaction tube 203. The gas supply holes 250e are formed at a plurality of positions along the lower side to the upper side of the reaction tube 203, and the gas supply holes 250e have the same size and are arranged at the same pitch.

The fourth nozzle 249d is installed in the buffer chamber 237 at an end opposite to the end where the gas supply holes 250e are formed, in a manner such that the first nozzle 249a is erected upward along the lower side to the upper side of the inner wall of the reaction tube 203 in a direction in which the wafers 200 are stacked. The fourth nozzle 249d is an L-shaped long nozzle. Gas supply holes 250d are formed through the lateral surface of the fourth nozzle 249d. The gas supply holes 250d are opened toward the centerline of the buffer chamber 237. Like the gas supply holes 250e of the buffer chamber 237, the gas supply holes 250d are formed at a plurality of positions along the lower side to the upper side of the reaction tube 203. If there is a small pressure difference between the inside of the buffer chamber 237 and the inside of the process chamber 201, it may be configured such that the gas supply holes 250d have the same size and are arranged at the same pitch from the upstream side (lower side) to the downstream side (upper side); however if the pressure difference is large, it may be configured such that the size of the gas supply holes 250d increases or the pitch of the gas supply holes 250d decreases as it goes from the upstream side to the downstream side.

In the current embodiment, since the size or pitch of the gas supply holes 250d of the fourth nozzle 249d is adjusted from the upstream side to the downstream side as described above, although the velocities of gas streams injected through the gas supply holes 250d are different, the flowrates of the gas streams injected through the gas supply holes 250d can be approximately equal. Gas streams injected through the respective gas supply holes 250d are first introduced into the buffer chamber 237 so as to reduce the velocity difference of the gas streams.

That is, gas injected into the buffer chamber 237 through the gas supply holes 250d of the fourth nozzle 249d is reduced in particle velocity and is then injected from the buffer chamber 237 to the inside of the process chamber 201 through the gas supply holes 250e of the buffer chamber 237. Owing to this structure, when gas injected into the buffer chamber 237 through the gas supply holes 250d of the fourth nozzle 249d is injected into the process chamber 201 through the gas supply holes 250e of the buffer chamber 237, the flowrate and velocity of the gas can be uniform.

A fourth gas supply system is constituted mainly by the fourth gas supply pipe 232d, the MFC 241d, the valve 243d, the fourth nozzle 249d, and the buffer chamber 237. In addition, a fourth inert gas supply system is constituted mainly by the fourth inert gas supply pipe 232h, the MFC 241h, and the on-off valve 243h.

For example, silicon source gas, that is, gas containing silicon (Si) (Silicon-containing gas) is supplied from the first gas supply pipe 232a to the inside of the process chamber 201 through the MFC 241a, the valve 243a, and the first nozzle 249a. For example, dichlorosilane ($SiH_2Cl_2$, DCS) gas may be used as silicon-containing gas.

For example, gas containing carbon (C) (carbon-containing gas) is supplied from the second gas supply pipe 232b to the inside of the process chamber 201 through the MFC 241b, the valve 243b, and the second nozzle 249b. For example, propylene ($C_3H_6$) gas may be used as carbon-containing gas. In addition, gas containing hydrogen (H) (H-containing gas) may be supplied from the second gas supply pipe 232b to the inside of the process chamber 201 through the MFC 241b, the valve 243b, and the second nozzle 249b. For example, hydrogen ($H_2$) gas may be used as hydrogen-containing gas.

For example, gas containing boron (B) (boron-containing gas) is supplied from the third gas supply pipe 232c to the inside of the process chamber 201 through the MFC 241c, the valve 243c, and the third nozzle 249c. For example, boron trichloride ($BCl_3$) gas may be used as boron-containing gas. In addition, gas containing oxygen (O) (oxygen-containing gas) may be supplied from the third gas supply pipe 232c to the inside of the process chamber 201 through the MFC 241c, the valve 243c, and the third nozzle 249c. For example, oxygen ($O_2$) gas or nitrous oxide ($N_2O$) may be used as oxygen-containing gas.

For example, gas containing nitrogen (N) (nitrogen-containing gas) is supplied from the fourth gas supply pipe 232d to the inside of the process chamber 201 through the MFC 241d, the valve 243d, the fourth nozzle 249d, and the buffer chamber 237. For example, ammonia ($NH_3$) gas may be used as nitrogen-containing gas.

For example, nitrogen ($N_2$) gas is supplied to the inside of the process chamber 201 from the inert gas supply pipes 232e, 232f, 232g, and 232h through the MFCs 241e, 241f, 241g, and 241h, the valves 243e, 243f, 243g, and 243h, and the gas supply pipes 232a, 232b, 232c, and 232d, the gas nozzles 249a, 249b, 249c, and 249d, and the buffer chamber 237.

In the case where gases are supplied from the gas supply pipes, for example, as described above, the first gas supply system constitutes a source gas supply system, that is, a silicon-containing gas supply system (silane-based gas supply system). In addition, the second gas supply system constitutes a carbon-containing or hydrogen-containing gas supply system. In addition, the third gas supply system constitutes a boron-containing or oxygen-containing gas supply system. In addition, the fourth gas supply system constitutes a nitrogen-containing gas supply system.

Inside the buffer chamber 237, as shown in FIG. 2, a first rod-shaped electrode 269 which is a first electrode having a long slender shape, and a second rod-shaped electrode which is a second electrode having a long slender shape are installed in a manner such that the first and second rod-shaped electrodes 269 and 270 extend from the lower side to the upper side of the reaction tube 203 in a direction in which wafers 200 are stacked. Each of the first and second rod-shaped electrodes 269 and 270 is parallel with the fourth nozzle 249d. The first and second rod-shaped electrodes 269 and 270 are respectively protected by electrode protection pipes 275 which cover the first and second rod-shaped electrodes 269 and 270 from the upper parts to the lower parts thereof. One of the first and second rod-shaped electrodes 269 and 270 is connected to a high-frequency power source 273 through a matching device 272, and the other is grounded to the earth (reference potential). Therefore, plasma can be generated in a plasma generation region between the first and second rod-shaped electrodes 269 and 270. A plasma source, which is a plasma generator (plasma generating unit), is constituted mainly by the first rod-shaped electrode 269, the second rod-shaped electrode 270, the electrode protection pipes 275, the matching device 272, and the high-frequency power source 273. The plasma source is used as an activation mechanism for activating gas by using plasma.

The electrode protection pipes 275 are configured such that the first and second rod-shaped electrodes 269 and 270 can be respectively inserted into the buffer chamber 237 in a state where the first and second rod-shaped electrodes 269 and 270 are isolated from the atmosphere of the buffer chamber 237. If the insides of the electrode protection pipes 275 have the same atmosphere as the outside air, the first and second rod-shaped electrodes 269 and 270 that are respectively inserted in the electrode protection pipes 275 may be oxidized due to heat emitted from the heater 207. Therefore, an inert gas purge mechanism is installed to prevent oxidation of the first rod-shaped electrode 269 or the second rod-shaped electrode 270 by filling or purging the insides of the electrode protection pipes 275 with inert gas such as nitrogen to maintain the oxygen concentration of the insides of the electrode protection pipes 275 at a sufficiently low level.

At the reaction tube 203, an exhaust pipe 231 is installed to exhaust the inside atmosphere of the process chamber 201. A vacuum exhaust device such a vacuum pump 246 is connected to the exhaust pipe 231 through a pressure detector (pressure detecting unit) such as a pressure sensor 245 configured to detect the inside pressure of the process chamber 201 and a pressure regulator (pressure regulating unit) such as an auto pressure controller (APC) valve 244, so that the inside of the process chamber 201 can be vacuum-evacuated to a predetermined pressure (vacuum degree). The APC valve 244 is an on-off valve, which can be opened and closed to start and stop vacuum evacuation of the inside of the process chamber 201 and can be adjusted in degree of valve opening for pressure adjustment. Mainly, the exhaust pipe 231, the APC valve 244, the vacuum pump 246, and the pressure sensor 245 constitute an exhaust system.

At the lower side of the reaction tube 203, a seal cap 219 is installed as a furnace port cover capable of hermetically closing the opened bottom side of the reaction tube 203. The seal cap 219 is configured to make contact with the bottom side of the reaction tube 203 in a perpendicular direction from the lower side. For example, the seal cap 219 is made of a metal such as stainless steel and has a disk shape. On the surface of the seal cap 219, an O-ring 220 is installed as a seal member configured to make contact with the bottom side of the reaction tube 203. At a side of the seal cap 219 opposite to the process chamber 201, a rotary mechanism 267 is installed to rotate the boat 217. A rotation shaft 255 of the rotary mechanism 267 is connected to the boat 217 (described later) through the seal cap 219, so as to rotate wafers 200 by rotating the boat 217. The seal cap 219 is configured to be vertically moved by an elevator such as a boat elevator 115 vertically installed outside the reaction tube 203, so that the boat 217 can be loaded into and unloaded from the process chamber 201.

The boat 217, which is a substrate support tool, is made of a heat-resistant material such as quartz or silicon carbide and is configured to support a plurality of wafers 200 in a state where the wafers 200 are horizontally oriented and arranged in multiple stages with the centers of the wafers 200 being aligned with each other. At the lower part of the boat 217, an insulating member 218 made of a heat-resistant material such as quartz or silicon carbide is installed so as to prevent heat transfer from the heater 207 to the seal cap 219. The insulating member 218 may include a plurality of insulating plates made of a heat-resistant material such as quartz or silicon carbide, and an insulating plate holder configured to support the insulating plates in a state where the insulating plates are horizontally oriented and arranged in multiple stages.

Inside the reaction tube 203, a temperature sensor 263 is installed as a temperature detector, and by controlling power supplied to the heater 207 based on temperature information detected by the temperature sensor 263, desired temperature distribution can be attained at the inside of the process chamber 201. Like the nozzles 249a, 249b, 249c, and 249d, the temperature sensor 263 has an L-shape and is installed along the inner wall of the reaction tube 203.

A controller 121, which is a control unit (control device), is connected to devices such as the MFCs 241a, 241b, 241c, 241d, 241e, 241f, 241g, and 241h; valves 243a, 243b, 243c, 243d, 243e, 243f, 243g, and 243h; the pressure sensor 245; the APC valve 244; the vacuum pump 246; the heater 207; the temperature sensor 263; the boat rotary mechanism 267; the boat elevator 115; the high-frequency power source 273; and the matching device 272. The controller 121 controls, for example, flowrates of various gases by using the MFCs 241a, 241b, 241c, 241d, 241e, 241f, 241g, and 241h; opening/closing operations of valves 243a, 243b, 243c, 243d, 243e, 243f, 243g, and 243h; opening/closing operations of the APC valve 244 and pressure adjusting operations of the APC valve 244 based on the pressure sensor 245; the temperature of the heater 207 based on the temperature sensor 263; starting/stopping operations of the vacuum pump 246; the rotation speed of the boat rotary mechanism 267; elevating operations of the boat elevator 115; power supply to the high-frequency power source 273; and impedance adjusting operations using the matching device 272.

Next, explanations will be given on three exemplary sequences (a first sequence, a second sequence, and a third sequence) for a process of forming an insulating film on a substrate, which is one of a plurality of processes for manufacturing a semiconductor device by using the above-described process furnace of the substrate processing apparatus. In the following descriptions, parts of the substrate processing apparatus are controlled by the controller 121.

In a conventional chemical vapor deposition (CVD) method or atomic layer deposition (ALD) method, for example, in a CVD method, a plurality of kinds of gases containing a plurality of elements that constitute a film to be formed are simultaneously supplied, and in an ALD method, a plurality of kinds of gases containing a plurality of elements that constitute a film to be formed are alternately supplied. Then, a $SiO_2$ film or a $Si_3N_4$ film is formed by controlling supply conditions such as the flowrates of the supply gases, the supply times of the supply gases, and plasma power. In such a technique, for example, in the case of forming a $SiO_2$ film, supply conditions are controlled so as to adjust the composition ratio of the $SiO_2$ film to the stoichiometric composition of $O/Si \approx 2$, and in the case of forming a $Si_3N_4$ film, supply conditions are controlled so as to adjust the composition ratio of the $Si_3N_4$ film to the stoichiometric composition of N/Si≈1.33.

However, according to an embodiment of the present invention, supply conditions are controlled so that the composition ratio of a film to be formed can be different from the stoichiometric composition. That is, supply conditions are controlled so that at least one of a plurality of elements constituting a film can be excessive in amount as compared with other elements in terms of the stoichiometric composition. Hereinafter, exemplary sequences for a process of forming a film while controlling the ratio of a plurality of elements constituting the film, that is, the composition ratio of the film, will be explained.

(First Sequence)

Figure 3:
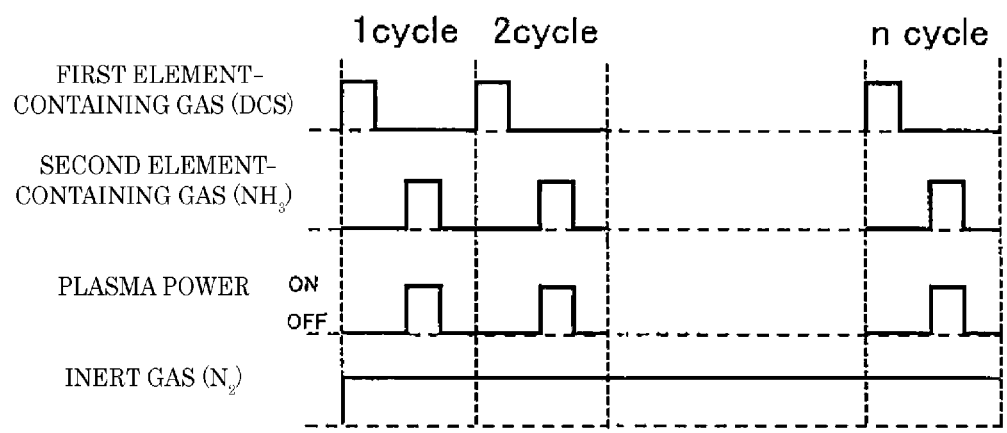
FIG. 3 is a view illustrating gas supply timing and plasma power supply timing in a first sequence according to an embodiment of the present invention.
Figure 6:
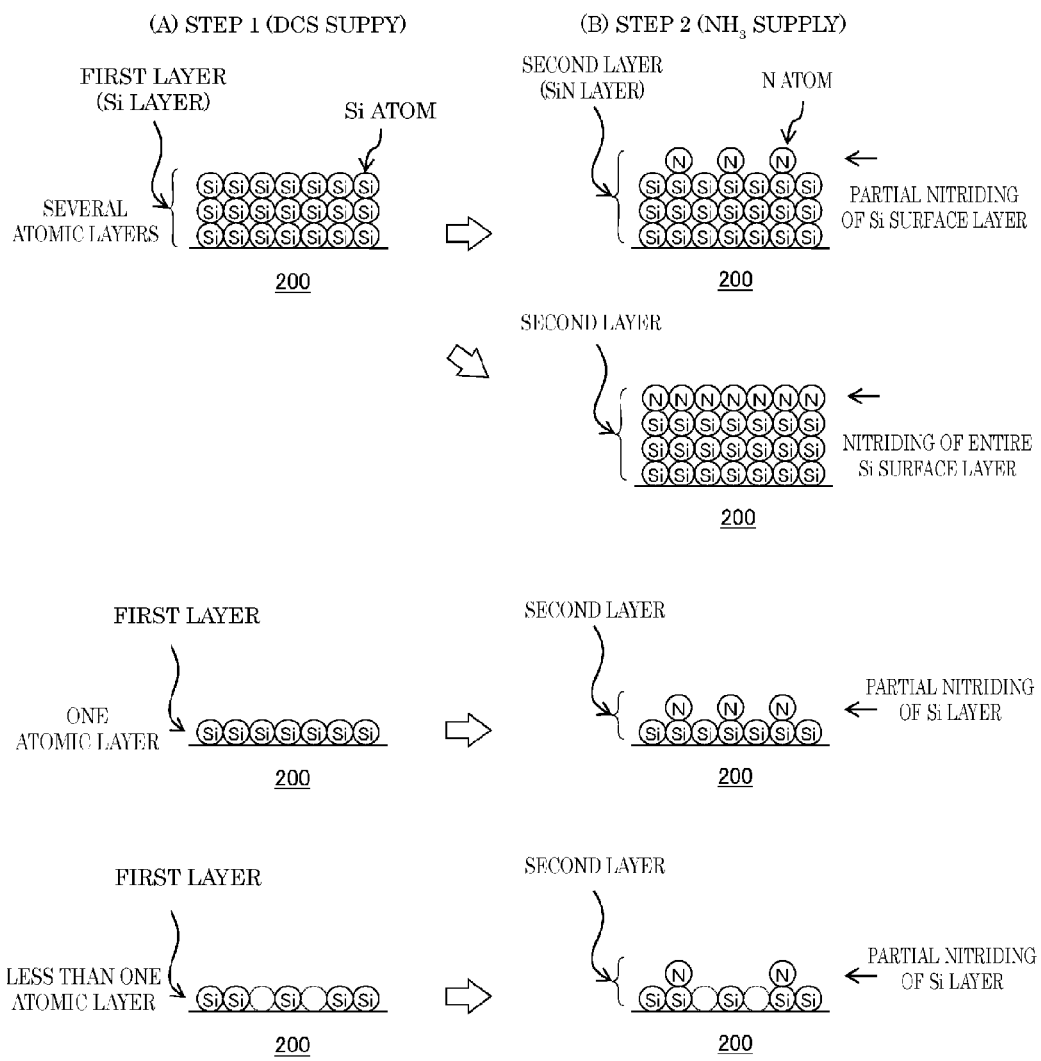
FIG. 6 is a schematic view illustrating formation of a silicon nitride film on a wafer according to the first sequence of the embodiment of the present invention.
Figure 7:
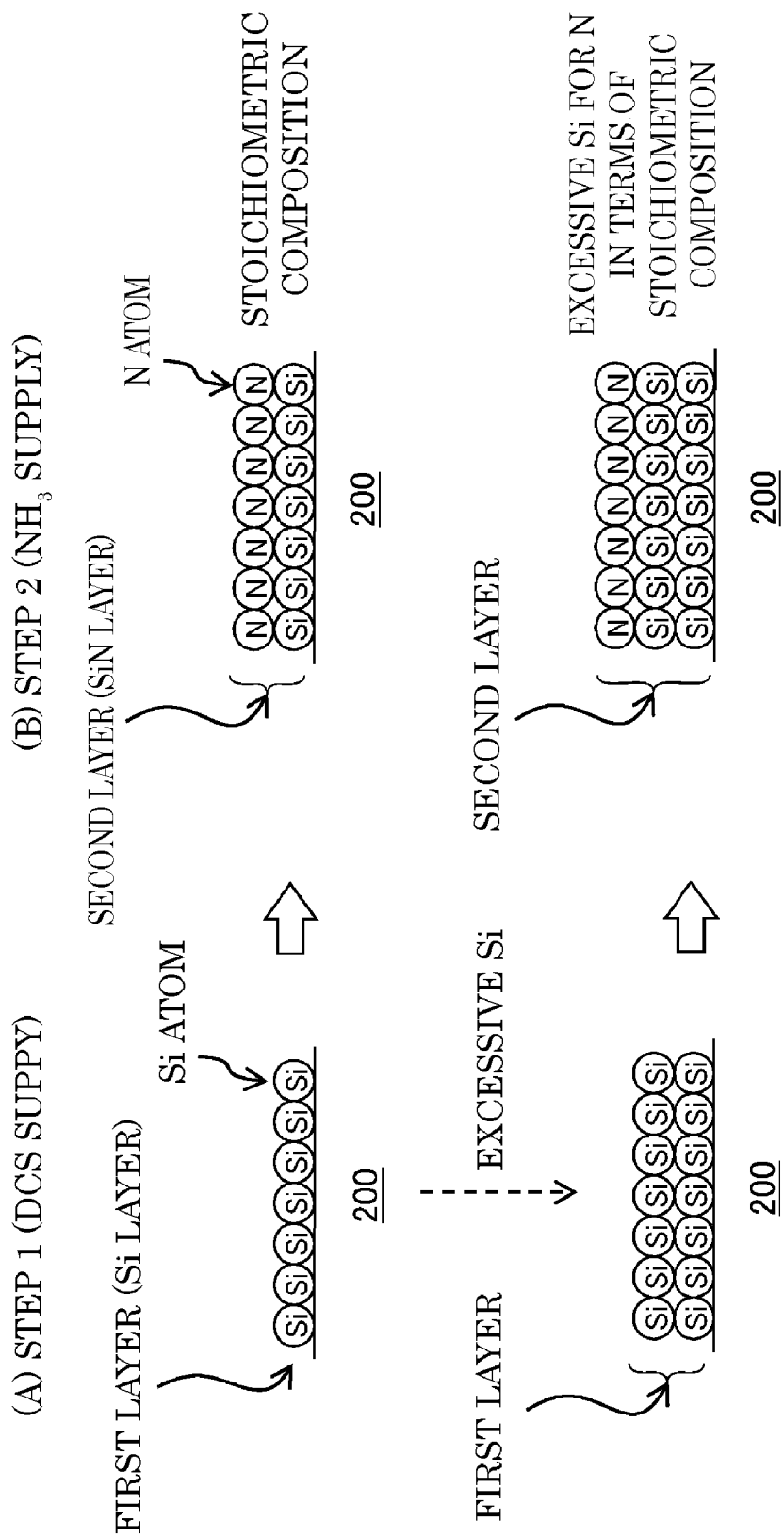
FIG. 7 is a schematic view illustrating a case where silicon is excessively supplied in Step 1 of the first sequence according to the embodiment of the present invention.
Figure 8:
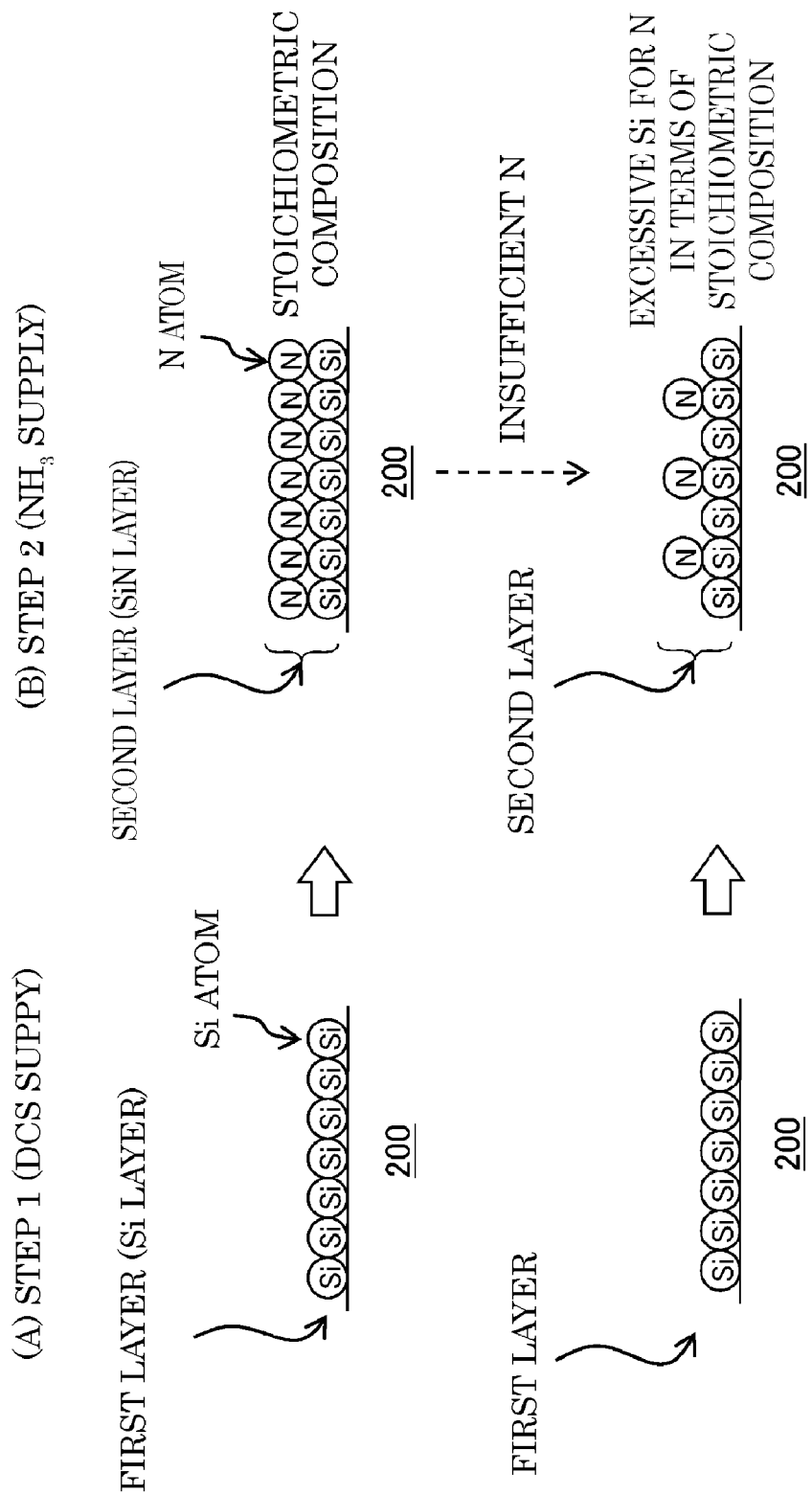
FIG. 8 is a schematic view illustrating a case where nitrogen is insufficiently supplied in Step 2 of the first sequence according to the embodiment of the present invention.

In the first place, a first sequence will now be described according to an embodiment. FIG. 3 is a view illustrating gas supply timing and plasma power supply timing in the first sequence of the current embodiment; FIG. 6 is a schematic view illustrating formation of a silicon nitride film on a wafer according to the first sequence of the current embodiment; FIG. 7 is a schematic view illustrating a case where silicon is excessively supplied in Step 1 of the first sequence according to the current embodiment; and FIG. 8 is a schematic view illustrating a case where nitrogen is insufficiently supplied in Step 2 of the first sequence according to the current embodiment.

The first sequence of the current embodiment includes a process of forming a first layer including a first element on a wafer 200 by supplying a gas containing the first element (a first element-containing gas) to the inside of a process vessel in which the wafer 200 is accommodated; and a process of forming a second layer including the first element and a second element by supplying a gas containing the second element (a second element-containing gas) to the inside of the process vessel to modify the first layer, wherein the process of forming the first layer and the process of forming the second layer are set to one cycle, and the cycle is repeated at least once so as to form a thin film including the first and second elements and having a predetermined thickness.

In the first sequence, the pressure of the inside of the process vessel, or the pressure of the inside of the process vessel and the time of supplying the gas in one process of the process of forming of the first layer and the process of forming of the second layer are controlled to be higher or longer than the pressure of the inside of the process vessel, or the pressure of the inside of the process vessel and the time of supplying the gas in the one process when the thin film having a stoichiometric composition is formed.

Alternatively, the pressure of the inside of the process vessel, or the pressure of the inside of the process vessel and the time of supplying the gas in the other process of the process of forming the first layer and the process of forming the second layer are controlled to be lower or shorter than the pressure of the inside of the process vessel, or the pressure of the inside of the process vessel and the time of supplying the gas in the other process when the thin film having the stoichiometric composition is formed.

In this way, one of the elements of the thin film can be excessive as compared with the other in terms of the stoichiometric composition.

The process of forming the first layer is performed under a condition where a CVD reaction is caused. In the process, a first element layer including less than one atomic layer to several atomic layers of the first element is formed on the wafer 200 as the first layer. The first layer may be a first element-containing gas adsorption layer. Preferably, the first element may be an element that can turn into solid by itself. The first element layer is a general term for a layer made of the first element, such as a continuous layer, a discontinuous layer, and a thin film in which such layers are overlapped. In addition, a continuous layer formed of the first element may also be called "a thin film." In addition, the first element-containing gas adsorption layer is a term including a continuous chemical adsorption layer and a discontinuous chemical adsorption layer that are formed of molecules of the first element-containing gas. Furthermore, the expression "a layer less than one atomic layer" is used to denote a discontinuous atomic layer. In a condition where the first element-containing gas decomposes by itself, the first element layer is formed by deposition of the first element on the wafer 200. In a condition where the first element-containing gas does not decompose by itself, a first element-containing gas adsorption layer is formed by adsorption of the first element-containing gas on the wafer 200. The former case where the first element layer is formed on the wafer 200 is more preferable than the latter case where the first element-containing gas adsorption layer is formed on the wafer 200 because the film forming rate of the former case is higher than that of the latter case.

In the process of forming the second layer, the second element-containing gas is activated by plasma or heat and supplied to the first layer to cause a part of the first layer to react with the second element-containing gas for modifying the first layer and thus forming the second layer including the first and second elements. For example, if several atomic layers of the first element are formed as the first layer in the process of forming the first layer, the surface atomic layer of the several atomic layers may partially or entirely be allowed to react with the second element-containing gas. Alternatively, the surface atomic layer and the next lower atomic layers among the several atomic layers of the first layer formed of the first element may be allowed to react with the second element-containing gas. However, in the case where the first layer is constituted by the several atomic layers including the first element, it may be preferable that only the surface atomic layer of the first layer be modified because the composition ratio of the thin film can be controlled more easily. Preferably, the second element may be an element that cannot turn into solid by itself. The second element-containing gas may be supplied after being activated by plasma or heat. FIG. 3 illustrates an example where the second element-containing gas is supplied after being activated by plasma. If the second element-containing gas is supplied after being activated by heat, soft reaction can be caused for soft modification.

For example, in the case where the composition ratio of the thin film is controlled in a manner such that the first element is excessive as compared with the second element in terms of the stoichiometric composition, the pressure of the inside of the process vessel, or the pressure of the inside of the process vessel and the time of supplying the gas in the process of forming the first layer are controlled to be higher or longer than the pressure of the inside of the process vessel, or the pressure of the inside of the process vessel and the time of supplying the gas in the process of forming the first layer when the thin film having the stoichiometric composition is formed. By controlling the process conditions in this way, as compared with the case where the thin film is formed to have the stoichiometric composition, the first element can be excessively supplied in the process of forming the first layer. Therefore, owing to the excessive supply of the first element in the process of forming the first layer, the modification reaction of the first layer is not saturated in the process of forming the second layer. That is, as compared with the case where the thin film is formed to have the stoichiometric composition, an excessive number of atoms of the first element are supplied in the process of forming the first layer, and thus, in the process of forming the second layer, the modification reaction of the first layer can be restricted.

Alternatively, the pressure of the inside of the process vessel, or the pressure of the inside of the process vessel and the time of supplying the gas in the process of forming the second layer are controlled to be lower or shorter than the pressure of the inside of the process vessel, or the pressure of the inside of the process vessel and the time of supplying the gas in the process of forming the second layer when the thin film having the stoichiometric composition is formed. By controlling the process conditions in this way, as compared with the case where the thin film is formed to have the stoichiometric composition, the second element can be insufficiently supplied in the process of forming the second layer. Therefore, owing to the insufficient supply of the second element in the process of forming the second layer, the modification reaction of the first layer is not saturated in the process of forming the second layer. That is, as compared with the case where the thin film is formed to have the stoichiometric composition, an insufficient number of atoms of the second element are supplied in the process of forming the second layer, and thus, in the process of forming the second layer, the modification reaction of the first layer can be restricted.

For example, like the O/Si ratio of a $SiO_2$ film or the N/Si ratio of a $Si_3N_4$ film, in the case where the portion of O or N being the second element is relatively great in the saturated bonding ratio, as described above, it is controlled such that modification reaction is not saturated in the process of forming the second layer.

Hereinafter, the first sequence of the current embodiment will be explained more specifically. In the following description, an explanation will be given on an example where a silicon nitride (SiN) film is formed on a substrate as an insulating film according to the sequence shown in FIG. 3 under the conditions where silicon (Si) is the first element, nitrogen (N) is the second element, DCS gas which is a silicon-containing gas is used as the first element-containing gas, and $NH_3$ gas which is a nitrogen-containing gas is used as the second element-containing gas. Furthermore, in the following description of the example, the composition ratio of the silicon nitride film is controlled such that silicon (Si) is excessive as compared with nitrogen (N) in terms of the stoichiometric composition. In addition, in the example, the first gas supply system constitutes a silicon-containing gas supply system (first element-containing gas supply system), and the fourth gas supply system constitutes a nitrogen-containing gas supply system (second element-containing gas supply system).

After a plurality of wafers 200 are charged into the boat 217 (wafer charging), as shown in FIG. 1, the boat 217 in which the plurality of wafers 200 are supported is lifted and loaded into the process chamber 201 by the boat elevator 115 (boat loading). In this state, the bottom side of the reaction tube 203 is sealed by the seal cap 219 with the O-ring 220 being disposed therebetween.

The inside of the process chamber 201 is vacuum-evacuated to a desired pressure (vacuum degree) by using the vacuum pump 246. At this time, the pressure inside the process chamber 201 is measured by the pressure sensor 245, and based on the measured pressure, the APC valve 244 is feedback-controlled (pressure adjustment). In addition, the inside of the process chamber 201 is heated to a desired temperature by using the heater 207. At this time, to obtain desired temperature distribution inside the process chamber 201, power to the heater 207 is feedback-controlled based on temperature information measured by the temperature sensor 263 (temperature adjustment). Next, the boat 217 is rotated by the rotary mechanism 267 to rotate the wafers 200 (wafer rotation). Thereafter, the following two steps are sequentially performed.

[Step 1]

The valve 243a of the first gas supply pipe 232a is opened to allow a flow of DCS gas. The flowrate of the DCS gas flowing through the first gas supply pipe 232a is controlled by the MFC 241a. Then, the DCS gas is supplied to the inside of the process chamber 201 through the gas supply holes 250a of the first nozzle 249a and is exhausted through the exhaust pipe 231. At the time, the valve 243e is also opened so that inert gas such as $N_2$ gas can flow through the inert gas supply pipe 232e. The flow rate of $N_2$ gas flowing through the inert gas supply pipe 232e is controlled by the MFC 241e. Then, together with the DCS gas, the $N_2$ gas is supplied to the inside of the process chamber 201 and is exhausted through the exhaust pipe 231.

At this time, the APC valve 244 is properly controlled to keep the inside pressure of the process chamber 201, for example, in the range of 10 Pa to 1000 Pa. The flowrate of the DCS gas controlled by the MFC 241a is, for example, in the range of 10 sccm to 1000 sccm. The time during which the wafers 200 are exposed to the DCS gas, that is, gas supply time (exposing time) is in the range of, for example, 2 seconds to 120 seconds. In addition, the temperature of the heater 207 is set to a predetermined temperature so that a CVD reaction can occur in the process chamber 201. That is, the temperature of the heater 207 is set such that the temperature of the wafers 200 can be in the range of, for example, 300° C. to 650° C. If the temperature of the wafers 200 is lower than 300° C., adsorption of DCS on the wafers 200 is difficult. On the other hand, if the temperature of the wafers 200 is higher than 650° C., uniformity can be easily broken due to strong CVD reaction. Therefore, it is preferable that the wafers 200 are kept in the temperature range of 300° C. to 650° C.

By the supply of the DCS gas, a first layer including silicon as a first element is formed on an under-layer film of each of the wafers 200. That is, as shown in section (A) of FIG. 6, a silicon layer (Si layer) is formed on the wafer 200 (on the under-layer film of the wafer 200) as a silicon-containing layer constituted by less than one atomic layer to several atomic layers. The silicon-containing layer may be a DCS chemical adsorption layer. Silicon is an element that can turn into solid by itself. The silicon layer is a general term for a layer made of silicon, such as a continuous layer, a discontinuous layer, and a thin film in which such layers are overlapped. In addition, a continuous layer formed of silicon may also be called "a thin film." In addition, the DCS chemical adsorption layer is a term including a continuous chemical adsorption layer of DCS molecules and a discontinuous chemical adsorption layer of DCS molecules. If the thickness of the silicon-containing layer formed on the wafer 200 is greater than the thickness of several atomic layers, nitridation effect cannot reach all over the silicon-containing layer in Step 2 (described later). In addition, the minimum of the silicon-containing layer that can be formed on the wafer 200 is less than one atomic layer. Therefore, preferably, the thickness of the silicon-containing layer ranges from the thickness of less than one atomic layer to the thickness of several atomic layers. In a condition where the DCS gas decomposes by itself, the silicon layer is formed on the wafer 200 by deposition of silicon on the wafer 200, and in a condition where the DCS gas does not decompose by itself, a DCS chemical adsorption layer is formed by chemical adsorption of DCS on the wafer 200. The former case where the silicon layer is formed on the wafer 200 is more preferable than the latter case where the DCS chemical adsorption layer is formed on the wafer 200 because the film forming rate of the former case is higher than that of the latter case.

After the silicon-containing layer is formed, the valve 243a is closed to interrupt the supply of DCS gas. At this time, in a state where the APC valve 244 of the exhaust pipe 231 is opened, the inside of the process chamber 201 is vacuum-evacuated by using the vacuum pump 246 so that DCS gas remaining in the process chamber 201 without participating in a reaction or after participating in the formation of the silicon-containing layer can be removed from the inside of the process chamber 201. Furthermore, at this time, in a state where the valve 243e is opened, supply of $N_2$ gas to the inside of the process chamber 201 is continued. Owing to this, DCS gas remaining in the process chamber 201 without participating in a reaction or after participating in the formation of the silicon-containing layer can be removed from the inside of the process chamber 201 more effectively.

Instead of DCS gas, another gas can be alternatively used as the silicon-containing gas. Examples of such alternative gases include: an inorganic source gas such as tetrachlorosilane ($SiCl_4$, abbreviation: TCS) gas, hexachlorodisilane ($Si_2Cl_6$, abbreviation: HCD) gas, and monosilane ($SiH_4$) gas; and an organic source gas such as aminosilane-based gas such as tetrakisdimethylaminosilane ($Si(N(CH_3)_2))_4$, abbreviation: 4DMAS) gas, trisdimethylaminosilane ($Si(N(CH_3)_2)_3H$, abbreviation: 3DMAS) gas, bisdiethylaminosilane ($Si(N(C_2H_5)_2)_2H_2$, abbreviation: 2DEAS) gas, and bis-tertiarybutylaminosilane ($SiH_2(NH(C_4H_9))_2$, abbreviation: BTBAS) gas. Instead of $N_2$ gas, a rare gas such as Ar gas, He gas, Ne gas, and Xe gas may be used as the inert gas.

[Step 2]

After removing gas remaining in the process chamber 201, the valve 243d of the fourth gas supply pipe 232d is opened to allow a flow of $NH_3$ gas through the fourth gas supply pipe 232d. The flowrate of the $NH_3$ gas flowing through the fourth gas supply pipe 232d is controlled by the MFC 241d. Then, the $NH_3$ gas is supplied to the inside of the buffer chamber 237 through the gas supply holes 250d of the fourth nozzle 249d. At this time, high-frequency power is applied across the first rod-shaped electrode 269 and the second rod-shaped electrode 270 from the high-frequency power source 273 through the matching device 272, and thus the $NH_3$ gas supplied to the inside of the buffer chamber 237 is plasma-excited as an activated species and is supplied to the inside of the process chamber 201 through the gas supply holes 250e while being exhausted through the exhaust pipe 231. At this time, the valve 243h is also opened to allow a flow of $N_2$ gas through the inert gas supply pipe 232h. Then, together with the $NH_3$ gas, the $N_2$ gas is supplied to the inside of the process chamber 201 and is exhausted through the exhaust pipe 231.

When the $NH_3$ gas is plasma-excited as an activated species and is allowed to flow, the APC valve 244 is properly controlled so as to adjust the inside pressure of the process chamber 201, for example, in the range of 10 Pa to 100 Pa. The flowrate of the $NH_3$ gas controlled by the MFC 241d is, for example, in the range of 100 sccm to 10000 sccm. The time during which the wafers 200 are exposed to the activated species obtained by plasma-exciting the $NH_3$ gas, that is, gas supply time (exposing time) is in the range of, for example, 2 seconds to 120 seconds. At this time, like in Step 1, the temperature of the heater 207 is set to a predetermined temperature so that the temperature of the wafers 200 can be in the range of, for example, 300° C. to 650° C. In addition, the high-frequency power applied across the first rod-shaped electrode 269 and the second rod-shaped electrode 270 from the high-frequency power source 273 is set to be in the range of, for example, 50 W to 1000 W. Since it is difficult to make the $NH_3$ gas reactive at the above-mentioned temperature range of the wafers 200 and the pressure range of the inside of the process chamber 201 due to a high reaction temperature of the $NH_3$ gas, the $NH_3$ gas is plasma-excited as an activated species and is then allowed to flow, and thus, the wafers 200 can be kept in the above-mentioned low temperature range. Alternatively, instead of plasma-exciting the $NH_3$ gas, the inside pressure of the process chamber 201 can be adjusted in the range of, for example, 50 Pa to 3000 Pa by properly controlling the APC valve 244 so as to activate the $NH_3$ gas not by plasma but by heat. In the case where the $NH_3$ gas is supplied after being activated by heat, soft reaction can be caused for soft nitriding (described later).

At this time, gas flowing in the process chamber 201 is either an activated species obtained by plasma-exciting $NH_3$ gas or thermally-activated $NH_3$ gas obtained by keeping the inside of the process chamber 201 at a high pressure, that is, DCS gas does not flow in the process chamber 201. Therefore, the $NH_3$ gas does not cause a vapor-phase reaction, but the $NH_3$ gas which is an activated species or is in an activated state is brought into reaction with a part of the silicon-containing layer formed on the wafers 200 as a first layer in Step 1. As a result, the silicon-containing layer is nitrided and modified into a second layer including silicon (first element) and nitrogen (second element), that is, into a silicon nitride (SiN) layer.

At this time, as shown in section (B) of FIG. 6, the nitriding reaction of the silicon-containing layer is not saturated. For example, in the case where a silicon layer including several atomic layers is formed in Step 1, at least a part of the surface layer (the surface atomic layer of the atomic layers) is nitrided. That is, the surface layer is partially or entirely nitrided. In this case, so as not to entirely nitride the silicon layer including several atomic layers, the silicon layer is nitrided in a non-saturated condition. Alternatively, according to conditions, the surface atomic layer and the next lower atomic layers among the several atomic layers of the silicon layer can be nitrided; however, the case where only the surface atomic layer is nitrided is preferable because the composition ratio of the silicon nitride film can be controlled more easily. In addition, for example, in the case where a silicon layer including one atomic layer or less than one atomic layer is formed in Step 1, a part of the silicon layer is nitrided. In this case, like in the above, so as not to entirely nitride the silicon layer including one atomic layer or less than one atomic layer, the silicon layer is nitrided in a non-saturated condition. In addition, nitrogen is an element that cannot turn into solid by itself.

Thereafter, the valve 243d of the fourth gas supply pipe 232d is closed to interrupt the supply of $NH_3$ gas. At this time, in a state where the APC valve 244 of the exhaust pipe 231 is opened, the inside of the process chamber 201 is vacuum-evacuated by using the vacuum pump 246 so that $NH_3$ gas remaining in the process chamber 201 without participating in a reaction or after participating in the nitriding reaction can be removed from the inside of the process chamber 201. Furthermore, at this time, in a state where the valve 243h is opened, supply of $N_2$ gas to the inside of the process chamber 201 is continued. Owing to this, $NH_3$ gas remaining in the process chamber 201 without participating in a reaction or after participating in the nitriding reaction can be removed from the inside of the process chamber 201 more effectively.

As a nitrogen-containing gas, not only $NH_3$ gas activated by plasma or heat, but also another gas such as $N_2$ gas, $NF_3$ gas, or $N_3H_8$ gas activated by plasma or heat may be used; in addition, such a gas may used after diluting the gas with a rare gas such as Ar gas, He gas, Ne gas, or Xe gas and activating the gas by plasma or heat.

By setting the above-described Step 1 and Step 2 to one cycle and repeating this cycle at least once, a thin film includes silicon (first element) and nitrogen (second element), that is, a silicon nitride (SiN) film can be formed on each of the wafers 200 to a predetermined thickness. Preferably, the cycle may be repeated a plurality of times.

In Step 1, the pressure of the inside of the process chamber 201, or the pressure of the inside of the process chamber 201 and the gas supply time are controlled to be higher or longer than the pressure of the inside of the process chamber 201, or the pressure of the inside of the process chamber 201 and the gas supply time in Step 1 when the silicon nitride film having a stoichiometric composition is formed. By controlling the process conditions in this way, as compared with the case where the silicon nitride film is formed to have the stoichiometric composition, silicon can be excessively supplied in Step 1 (refer to section (A) in FIG. 7). Therefore, owing to the excessive supply of silicon in Step 1, the nitriding reaction of the silicon-containing layer is not saturated in Step 2 (refer to section (B) in FIG. 7). That is, as compared with the case where the silicon nitride film is formed to have the stoichiometric composition, an excessive number of silicon atoms are supplied in Step 1, and thus, in Step 2, the nitriding reaction of the silicon-containing layer can be restricted. Accordingly, the composition ratio of the silicon nitride (SiN) film can be controlled in a manner such that silicon (Si) is excessive as compare with nitrogen (N) in terms of the stoichiometric composition.

In the upper side of FIG. 7, schematic partial section views of a wafer are shown to explain reaction states of steps during which a SiN film is formed to have a stoichiometric composition. In the lower side of FIG. 7, schematic partial section views of a wafer are shown to explain reaction states of steps during which silicon (Si) is excessively supplied to form a SiN film having excessive silicon (Si) as compared with nitrogen (N) in terms of stoichiometric composition. Section (A) and section (B) of FIG. 7 illustrate reaction states of Step 1 and Step 2, respectively. The upper side of FIG. 7 shows an exemplary case where a continuous Si layer constituted by one atomic layer is formed in Step 1 and the Si layer is entirely nitrided in Step 2, and the lower side of FIG. 7 shows an exemplary case where a continuous Si layer constituted by two atomic layers is formed in Step 1 and the surface atomic layer of the Si layer is nitrided in Step 2.

Alternatively, in Step 2, the pressure of the inside of the process chamber 201, or the pressure of the inside of the process chamber 201 and the gas supply time are controlled to be lower or shorter than the pressure of the inside of the process chamber 201, or the pressure of the inside of the process chamber 201 and the gas supply time in Step 2 when the silicon nitride having the stoichiometric composition is formed. By controlling the process conditions in this way, as compared with the case where the silicon nitride film is formed to have the stoichiometric composition, nitrogen can be insufficiently supplied in Step 2 (refer to section (B) in FIG. 8). Therefore, owing to the insufficient supply of nitrogen in Step 2, the nitriding reaction of the silicon-containing layer is not saturated in Step 2. That is, as compared with the case where the silicon nitride film is formed to have the stoichiometric composition, an insufficient number of nitrogen atoms are supplied in Step 2, and thus, in Step 2, the nitriding reaction of the silicon-containing layer can be restricted. Accordingly, the composition ratio of the silicon nitride (SiN) film can be controlled in a manner such that silicon (Si) is excessive as compare with nitrogen (N) in terms of the stoichiometric composition.

In the upper side of FIG. 8, schematic partial section views of a wafer are shown to explain reaction states of steps during which a SiN film is formed to have a stoichiometric composition. In the lower side of FIG. 8, schematic partial section views of a wafer are shown to explain reaction states of steps during which nitrogen (N) is insufficiently supplied to form a SiN film having excessive silicon (Si) as compared with nitrogen (N) in terms of stoichiometric composition. Section (A) and section (B) of FIG. 8 illustrate reaction states of Step 1 and Step 2, respectively. The upper side of FIG. 8 shows an exemplary case where a continuous Si layer constituted by one atomic layer is formed in Step 1 and the Si layer is entirely nitrided in Step 2, and the lower side of FIG. 8 shows an exemplary case where a continuous Si layer constituted by one atomic layer is formed in Step 1 and the surface of the Si layer is partially nitrided in Step 2.

After a silicon nitride film having a predetermined composition and thickness is formed in the film-forming process, inert gas such as $N_2$ gas is supplied to the inside of the process chamber 201 and is exhausted from the inside of the process chamber 201 so as to purge the inside of the process chamber 201 (gas purge). Then, the inside atmosphere of the process chamber 201 is replaced with inert gas (replacement with inert gas), and the inside of the process chamber 201 returns to atmospheric pressure (return to atmospheric pressure).

Thereafter, the seal cap 219 is moved downward by the boat elevator 115 so as to open the bottom side of the reaction tube 203 and unload the boat 217 in which the processed wafers 200 are supported from the inside of the reaction tube 203 through the bottom side of the reaction tube 203 (boat unloading). After that, the processed wafers 200 are discharged from the boat 217 (wafer discharging).

In the above-described example of the first sequence of the current embodiment, a silicon-containing gas and a nitrogen-containing gas are respectively used as a first element-containing gas and a second element-containing gas so as to form a SiN film; however, the present invention is not limited to the example but various changes and modifications can be made within the scope and spirit of the present invention.

For example, an aluminum-containing gas and a nitrogen-containing gas may be used as a first element-containing gas and a second element-containing gas, respectively, so as to form an aluminum nitride (AlN) film; a titanium-containing gas and a nitrogen-containing gas may be used as a first element-containing gas and a second element-containing gas, respectively, so as to form a titanium nitride (TiN) film; or a boron-containing gas and a nitrogen-containing gas may be used as a first element-containing gas and a second element-containing gas, respectively, so as to form a boron nitride (BN) film. In addition, for example, a silicon-containing gas and an oxygen-containing gas may be used as a first element-containing gas and a second element-containing gas, respectively, so as to form a silicon oxide (SiO) film;

an aluminum-containing gas and an oxygen-containing gas may be used as a first element-containing gas and a second element-containing gas, respectively, so as to form an aluminum oxide (AlO) film; or a titanium-containing gas and an oxygen-containing gas may be used as a first element-containing gas and a second element-containing gas, respectively, so as to form a titanium oxide (TiO) film. Furthermore, a silicon-containing gas and a carbon-containing gas may be used as a first element-containing gas and a second element-containing gas, respectively, so as to form a silicon carbide (SiC) film.

As an aluminum-containing gas, for example, trimethylaluminum ($Al(CH_3)_3$, abbreviation: TMA) gas may be used. As a titanium-containing gas, for example, titanium tetrachloride ($TiCl_4$) gas or tetrakis(dimethylamido)titanium ($Ti[N(CH_3)_2]_4$, abbreviation: TDMAT) gas may be used. As a boron-containing gas, for example, boron trichloride ($BCl_3$) gas or diborane ($B_2H_6$) gas may be used. As a carbon-containing gas, for example, propylene ($C_3H_6$) gas or ethylene ($C_2H_4$) gas may be used. As an oxygen-containing gas, for example, oxygen ($O_2$) gas, ozone ($O_3$) gas, nitric oxide (NO) gas, nitrous oxide ($N_2O$), or vapor ($H_2O$) may be used.

In the case where an oxygen-containing gas is used as a second element-containing gas, a hydrogen-containing gas can be supplied together with the oxygen-containing gas. If an oxygen-containing gas and a hydrogen-containing gas are supplied to the inside of a process vessel kept at a pressure lower than atmospheric pressure (decompressed state), the oxygen-containing gas and the hydrogen-containing gas react with each other to produce an oxidizing species containing oxygen (such as atomic oxygen) so that a first layer can be oxidized by the oxidizing species. In this case, oxidation can be performed with increased oxidizing power as compared with the case of using an oxygen-containing gas only. This oxidizing treatment is performed under non-plasma and decompressed state. As the hydrogen-containing gas, for example, hydrogen ($H_2$) gas may be used.

As explained above, according to the first sequence of the current embodiment, a semiconductor element such as silicon (Si) or boron (B), or a metal element such as aluminum (Al) or titanium (Ti) may be used as a first element, and an element such as nitrogen (N), carbon (C), or oxygen (O) may be used as a second element.

(Second Sequence)

Next, a second sequence will now be described according to an embodiment.

Figure 4:
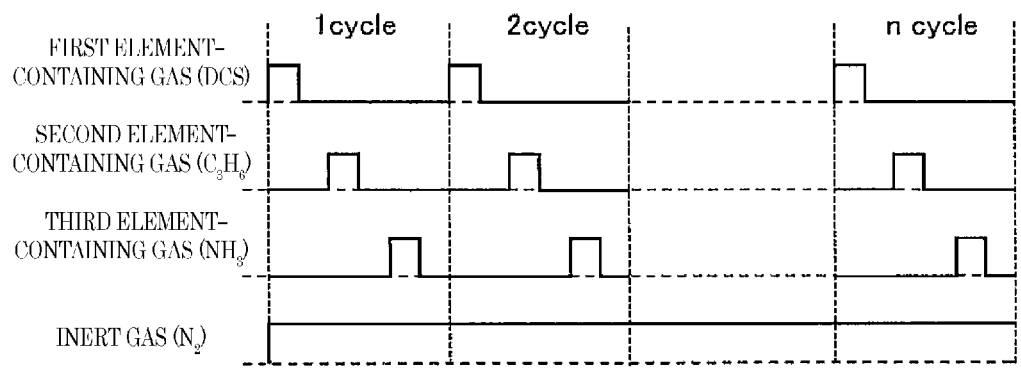
FIG. 4 is a view illustrating gas supply timing in a second sequence according to an embodiment of the present invention.
Figure 9:
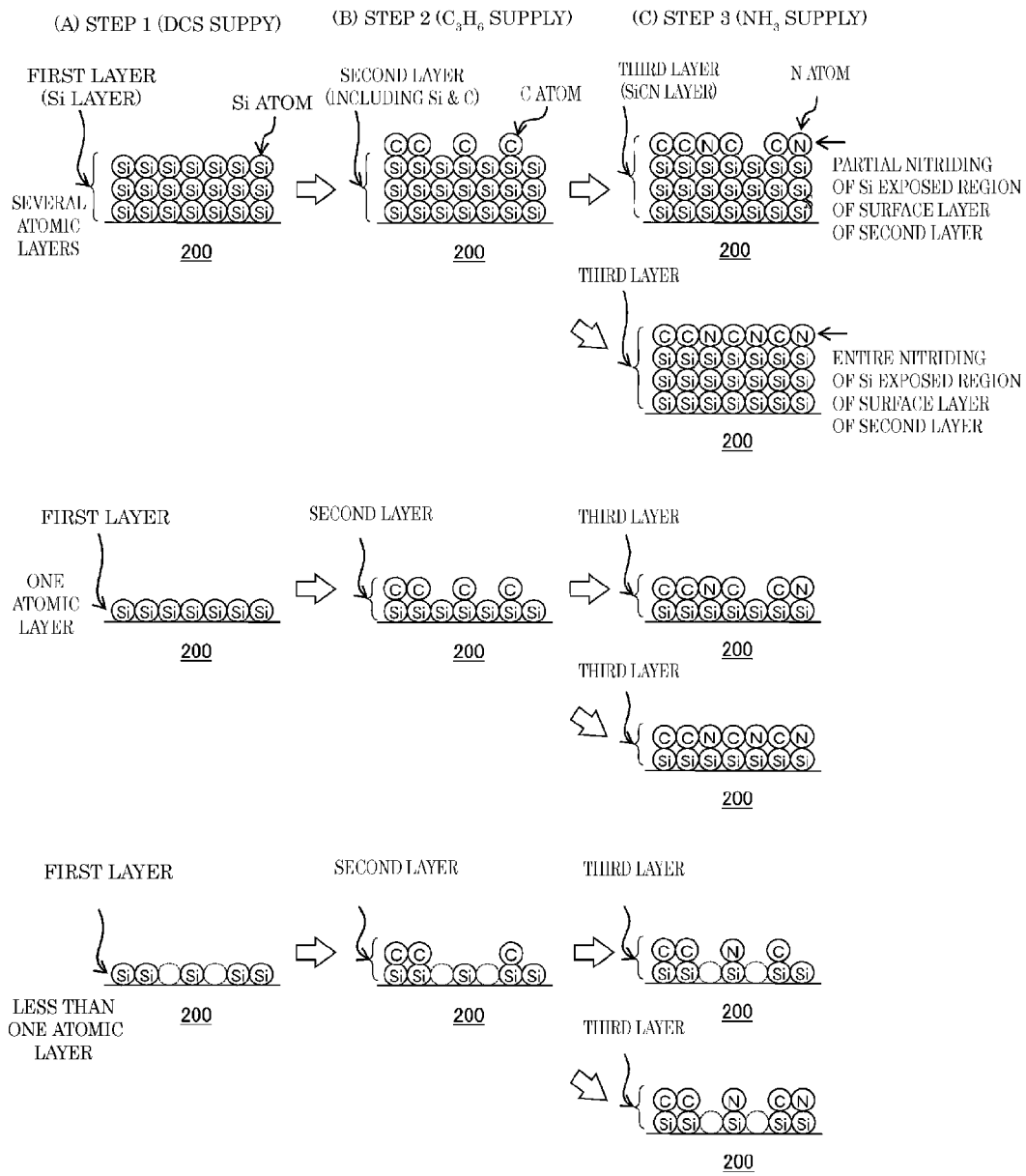
FIG. 9 is a schematic view illustrating formation of a silicon carbonitride film on a wafer according to the second sequence of the embodiment of the present invention.
Figure 10:
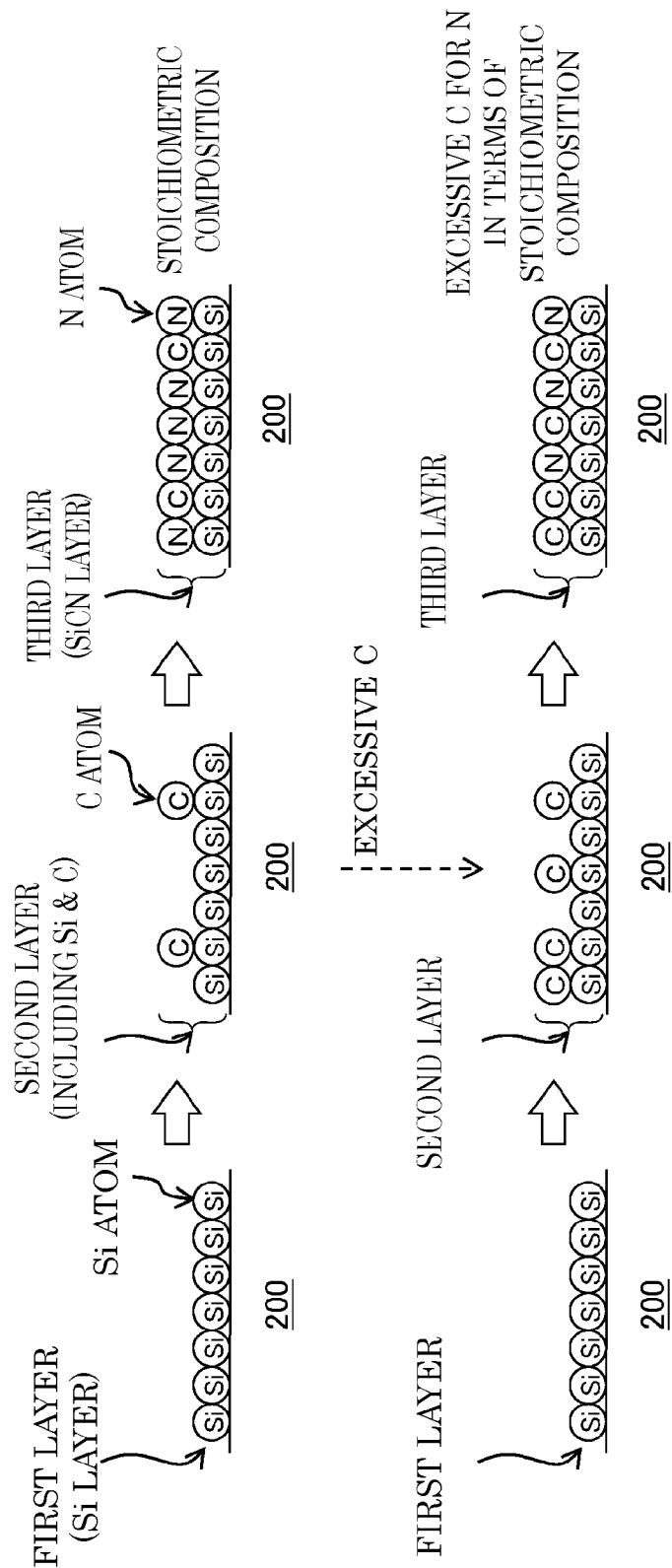
FIG. 10 is a schematic view illustrating a case where carbon is excessively supplied in Step 2 of the second sequence according to the embodiment of the present invention.
Figure 11:
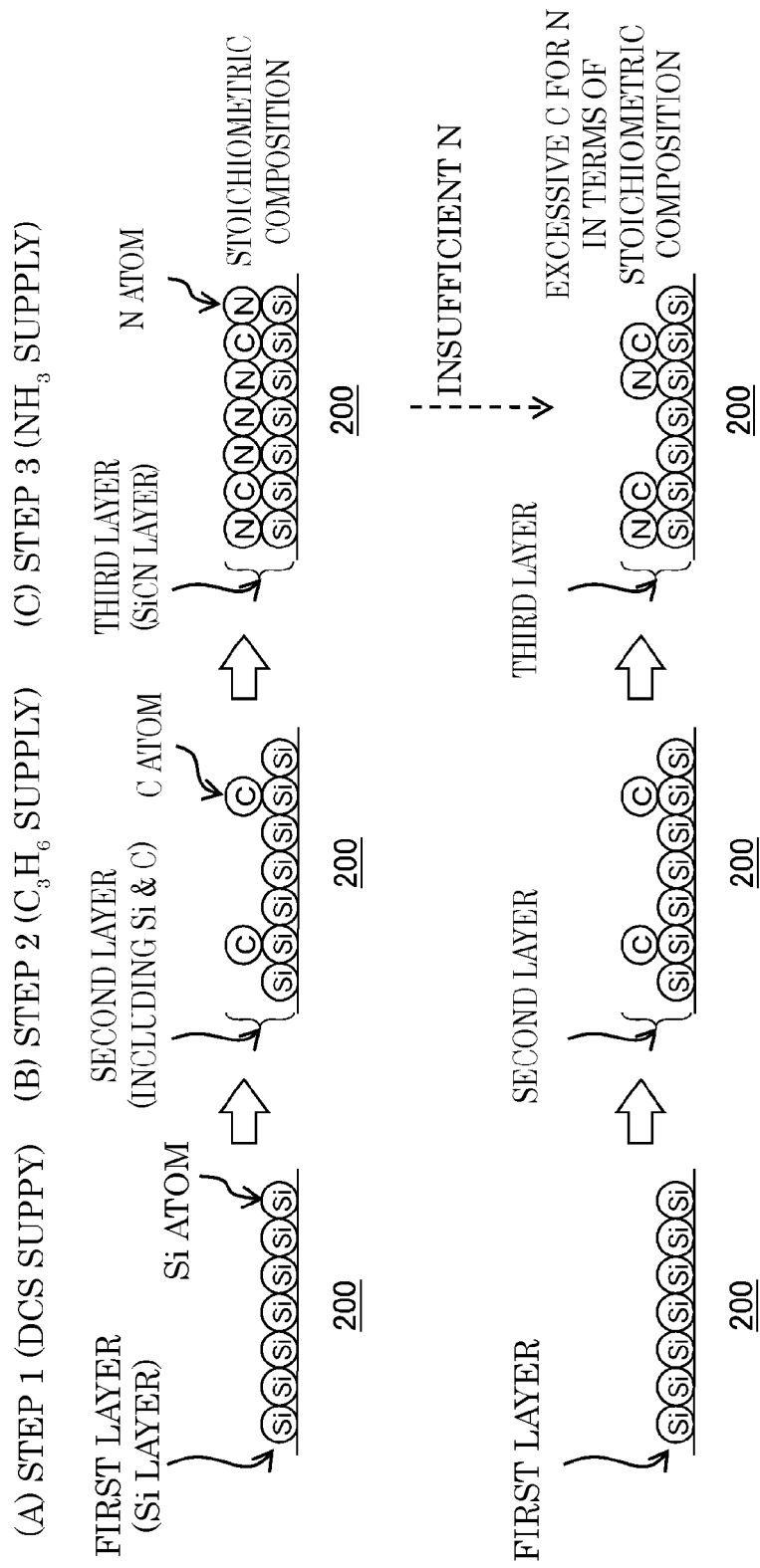
FIG. 11 is a schematic view illustrating a case where nitrogen is insufficiently supplied in Step 3 of the second sequence according to the embodiment of the present invention.

FIG. 4 is a view illustrating gas supply timing in the second sequence according to an embodiment of the present invention; FIG. 9 is a schematic view illustrating formation of a silicon carbonitride film on a wafer according to the second sequence of the embodiment of the present invention; FIG. 10 is a schematic view illustrating a case where carbon is excessively supplied in Step 2 of the second sequence according to the embodiment of the present invention; and FIG. 11 is a schematic view illustrating a case where nitrogen is insufficiently supplied in Step 3 of the second sequence according to the embodiment of the present invention. The second sequence of the current embodiment relates to a method of controlling a composition ratio of three elements.

The second sequence of the current embodiment includes a process of forming a first layer including a first element on a wafer 200 by supplying a gas containing the first element (a first element-containing gas) to the inside of a process vessel in which the wafer 200 is accommodated;

a process of forming a second layer including the first element and a second element by supplying a gas containing the second element (second element-containing gas) to the inside of the process vessel, wherein the second layer is formed by forming a layer including the second element on the first layer, or the second layer is formed by modifying the first layer; and a process of forming a third layer including the first element, the second element, and a third element by supplying a gas containing the third element (a third element-containing gas) to the inside of the process vessel to modify the second layer, wherein the process of forming the first layer, the process of forming the second layer, and the process of forming the third layer are set to one cycle, and the cycle is repeated at least once so as to form a thin film including the first to third elements and having a predetermined thickness.

In the second sequence, the pressure of the inside of the process vessel, or the pressure of the inside of the process vessel and the time of supplying the gas in one process of the process of forming of the first layer, the process of forming of the second layer, and the process of forming of the third layer are controlled to be higher or longer than the pressure of the inside of the process vessel, or the pressure of the inside of the process vessel and the time of supplying the gas in the one process when the thin film having a stoichiometric composition is formed.

Alternatively, the pressure of the inside of the process vessel, or the pressure of the inside of the process vessel and the time of supplying the gas in the other process of the process of forming of the first layer, the process of forming of the second layer, and the process of forming of the third layer are controlled to be lower or shorter than the pressure of the inside of the process vessel, or the pressure of the inside of the process vessel and the time of supplying the gas in the other process when the thin film having the stoichiometric composition is formed.

In this way, one of the elements of the thin film can be excessive as compared with the others in terms of the stoichiometric composition.

In the case of a thin film made of two elements (two-element thin film), the stoichiometric composition is unique. For example, the stoichiometric composition of a SiN film is unique, that is, Si:N=3:4. However, in the case of a three-element thin film, the stoichiometric composition is not unique unlike that of a two-element thin film but is two or more. In the second sequence of the current embodiment, a thin film is formed in a manner such that the thin film has a composition ratio different from any of the stoichiometric compositions.

The process of forming the first layer is the same as the process of forming the first layer in the first sequence. That is, things regarding the process of forming the first layer, such as process conditions, motivated reaction, layers, layer thickness, examples of the first element, examples of the first element-containing gas, and examples of the first layer, are the same as those regarding the process of forming the first layer in the first sequence.

In the process of forming the second layer, the second element-containing gas is activated by plasma or heat and is then supplied to the first layer, so that a layer including the second element and constituted by less than one to several atomic layers can be formed on the first layer or the first layer can be modified by reaction between a part of the first layer and the second element-containing gas. In this way, the second layer including the first and second elements is formed.

In the case where the second layer is formed by forming a layer including the second element on the first layer, the layer including the second element may be a second element layer or a second element-containing gas adsorption layer. The second element-containing gas adsorption layer includes an adsorption layer formed of a material decomposed from the second element-containing gas. The second element layer is a general term for a layer made of the second element, such as a continuous layer, a discontinuous layer, and a thin film in which such layers are overlapped. In addition, a continuous layer formed of the second element may also be called "a thin film." In addition, the second element-containing gas adsorption layer is a term including a continuous chemical adsorption layer and a discontinuous chemical adsorption layer that are formed of molecules of the second element-containing gas or molecules of a material decomposed from the second element-containing gas. Preferably, the layer including the second element may be a discontinuous chemical adsorption layer formed of molecules of the second element-containing gas or molecules of a material decomposed from the second element-containing gas, that is, the layer including the second element may be a chemical adsorption layer constituted by less than one atomic layer, so as to improve the controllability of the composition ratio of the thin film.

In the case where the second layer is formed by modifying the first layer, the first layer is modified by the same method as the method used for modifying the first layer in the process of forming the second layer in the first sequence.

The second element-containing gas may be supplied after being activated by plasma or heat. FIG. 4 illustrates an example where the second element-containing gas is supplied after being activated by heat, that is, an example for causing a soft reaction.

In the process of forming the third layer, the third element-containing gas is activated by plasma or heat and is then supplied to the second layer, so as to modify the second layer for forming the third layer including the first to third elements. For example, if the second layer is formed to have the first and second elements and be constituted by several atomic layers in the process of forming the second layer, the surface atomic layer of the several atomic layers may partially or entirely be allowed to react with the third element-containing gas. Alternatively, the surface atomic layer and the next lower atomic layers among the several atomic layers of the second layer formed of the first and second elements may be allowed to react with the third element-containing gas. However, in the case where the second layer is constituted by the several atomic layers including the first and second elements, it may be preferable that only the surface atomic layer of the second layer be modified because the composition ratio of the thin film can be controlled more easily. Preferably, the third element may be an element that cannot turn into solid by itself. The third element-containing gas may be supplied after being activated by plasma or heat. FIG. 4 illustrates an example where the third element-containing gas is supplied after being activated by heat, that is, an example of causing a soft reaction for performing a soft modification.

A method such as a method of controlling the composition ratio of the thin film in a manner such that the first element is excessive as compared with the second element in terms of the stoichiometric composition is the same as that used in the first sequence.

In the case where the composition ratio of the thin film is controlled in a manner such that the second element is excessive as compared with the third element in terms of the stoichiometric composition or the third element is excessive as compared with the second element in terms of the stoichiometric composition, the composition ratio is controlled based on one of the two elements.

For example, in the case where the composition ratio of the thin film is controlled in a manner such that the second element is excessive as compared with the third element in terms of the stoichiometric composition, the pressure of the inside of the process vessel, or the pressure of the inside of the process vessel and the time of supplying the gas in the process of forming the second layer are controlled to be higher or longer than the pressure of the inside of the process vessel, or the pressure of the inside of the process vessel and the time of supplying the gas in the process of forming the second layer when the thin film having the stoichiometric composition is formed. By controlling the process conditions in this way, as compared with the case where the thin film is formed to have the stoichiometric composition, the second element can be excessively supplied in the process of forming the second layer. Therefore, owing to the excessive supply of the second element in the process of forming the second layer, a region of the second layer that can be modified in the process of forming the third layer is reduced. That is, as compared with the case where the thin film is formed to have the stoichiometric composition, an excessive number of atoms of the second element are supplied in the process of forming the second layer, and thus, in the process of forming the third layer, the modification reaction of the second layer can be restricted.

Alternatively, the pressure of the inside of the process vessel, or the pressure of the inside of the process vessel and the time of supplying the gas in the process of forming of the third layer are controlled to be lower or shorter than the pressure of the inside of the process vessel, or the pressure of the inside of the process vessel and the time of supplying the gas in the process of forming the third layer when the thin film having the stoichiometric composition is formed. By controlling the process conditions in this way, as compared with the case where the thin film is formed to have the stoichiometric composition, the third element can be insufficiently supplied in the process of forming the third layer. Therefore, owing to the insufficient supply of the third element in the process of forming the third layer, the modification reaction of the second layer can be restricted in the process of forming the third layer. That is, as compared with the case where the thin film is formed to have the stoichiometric composition, an insufficient number of atoms of the third element are supplied in the process of forming the third layer, and thus, in the process of forming the third layer, the modification reaction of the second layer can be restricted.

In addition, for example, in the case where the composition ratio of the thin film is controlled in a manner such that the third element is excessive as compared with the second element in terms of the stoichiometric composition, the pressure of the inside of the process vessel, or the pressure of the inside of the process vessel and the time of supplying the gas in the process of forming the second layer are controlled to be lower or shorter than the pressure of the inside of the process vessel, or the pressure of the inside of the process vessel and the time of supplying the gas in the process of forming the second layer when the thin film having the stoichiometric composition is formed. By controlling the process conditions in this way, as compared with the case where the thin film is formed to have the stoichiometric composition, the second element can be insufficiently supplied in the process of forming the second layer. Therefore, owing to the insufficient supply of the second element in the process of forming the second layer, a layer including the second element is formed in a smaller region or modification reaction of the first layer is restricted. As a result, the third element becomes excessive as compared with the second element in terms of the stoichiometric composition.

If the second element is insufficiently supplied in the process of forming the second layer, a region of the second layer that can be modified in the process of forming the third layer is increased. In this case, if the pressure of the inside of the process vessel, or the pressure of the inside of the process vessel and the time of supplying the gas in the process of forming the third layer are controlled to be higher or longer than the pressure of the inside of the process vessel, or the pressure of the inside of the process vessel and the time of supplying the gas in the process of forming the third layer when the thin film having the stoichiometric composition is formed, the third element can be excessively supplied in the process of forming the third layer, and thus the third element can be controlled to be much excessive as compared with the second element in terms of the stoichiometric composition. That is, by a combination of insufficient supply of the second element in the process of forming the second layer and excessive supply of the third element in the process of forming the third layer, the modification reaction of the second layer can be facilitated in the process of forming the third layer, and thus the composition ratio of the thin film can be controlled in a manner such that the third element is much excessive as compared with the second element in terms of the stoichiometric composition.

Hereinafter, the second sequence of the current embodiment will be described more specifically. In the following description, an explanation will be given on an example where a silicon carbonitride (SiCN) film is formed on a substrate as an insulating film according to the sequence shown in FIG. 4 under the conditions where silicon (Si) is the first element, carbon (C) is the second element, nitrogen (N) is the third element, DCS gas which is a silicon-containing gas is used as the first element-containing gas, $C_3H_6$ gas which is a carbon-containing gas is used as the second element-containing gas, and $NH_3$ gas which is a nitrogen-containing gas is used as the third element-containing gas. Furthermore, in the following description of the example, the composition ratio of the silicon carbonitride film is controlled such that carbon (C) is excessive as compared with nitrogen (N) in terms of the stoichiometric composition. In addition, in the example, the first gas supply system constitutes a silicon-containing gas supply system (first element-containing gas supply system), the second gas supply system constitutes a carbon-containing gas supply system (second element-containing gas supply system), and the fourth gas supply system constitutes a nitrogen-containing gas supply system (third element-containing gas supply system).

Wafer charging, boat loading, pressure adjustment, temperature adjustment, and wafer rotation are performed in the same way as in the first sequence, and then, the following three steps are sequentially performed.

[Step 1]

Step 1 is performed in the same way as Step 1 of the first sequence. That is, things regarding Step 1, such as process conditions, motivated reaction, layers, layer thickness, examples of the first element, examples of the first element-containing gas, and examples of the first layer, are the same as those regarding Step 1 of the first sequence (refer to section (A) of FIG. 9).

[Step 2]

After completing Step 1 and removing gas remaining in the process chamber 201, the valve 243b of the second gas supply pipe 232b is opened to allow a flow of $C_3H_6$ gas through the second gas supply pipe 232b. The flowrate of the $C_3H_6$ gas flowing through the second gas supply pipe 232b is controlled by the MFC 241b. Then, the $C_3H_6$ gas is supplied to the inside of the process chamber 201 through the gas supply holes 250b of the second nozzle 249b and is exhausted through the exhaust pipe 231. At this time, the valve 243f is also opened to allow a flow of $N_2$ gas through the inert gas supply pipe 232f. The $N_2$ gas is supplied to the inside of the process chamber 201 together with the $C_3H_6$ gas and is exhausted through the exhaust pipe 231.

At this time, the APC valve 244 is properly controlled so as to adjust the inside pressure of the process chamber 201, for example, in the range of 50 Pa to 3000 Pa. The flowrate of the $C_3H_6$ gas controlled by the MFC 241b is, for example, in the range of 100 sccm to 10000 sccm. The time during which wafers 200 are exposed to the $C_3H_6$ gas, that is, gas supply time (exposing time) is in the range of, for example, 2 seconds to 120 seconds. At this time, like in Step 1, the temperature of the heater 207 is set to a predetermined temperature so that the temperature of the wafers 200 can be in the range of, for example, 300° C. to 650° C. In the case where the $C_3H_6$ gas is activated by heat and is supplied, soft reaction can be caused, and thus a carbon-containing layer can be easily formed (described later).

At this time, gas flowing in the process chamber 201 is $C_3H_6$ gas activated by heat and DCS gas does not flow in the process chamber 201. Therefore, without causing a vapor-phase reaction, the $C_3H_6$ gas which is in an activated state is supplied to the wafers 200, and at this time, as shown in section (B) of FIG. 9, a carbon-containing layer constituted by less than one atomic layer, that is, a discontinuous carbon-containing layer, is formed on a silicon-containing layer formed in Step 1. In this way, a second layer including silicon (first element) and carbon (second element) is formed. In some cases, according to conditions, a part of the silicon-containing layer reacts with the $C_3H_6$ gas, and as a result, the silicon-containing layer is modified (carbonized) to form a second layer including silicon and carbon.

The carbon-containing layer formed on the silicon-containing layer may be a carbon layer (C-layer), a chemical adsorption layer of $C_3H_6$, or a chemical adsorption layer of $C_xH_y$ (a material decomposed from $C_3H_6$). It is necessary that the carbon layer is a discontinuous layer made of carbon. In addition, it is necessary that the chemical adsorption layer of $C_3H_6$ or $C_xH_y$ is a discontinuous chemical adsorption layer made of $C_3H_6$ or $C_xH_y$. In the case where the carbon-containing layer formed on the silicon-containing layer is a continuous layer, for example, if adsorption of $C_xH_y$ on the silicon-containing layer is saturated and thus a continuous chemical adsorption layer of $C_xH_y$ is formed on the silicon-containing layer, the entire surface of the silicon-containing layer is covered with the chemical adsorption layer of $C_xH_y$. In this case, silicon does not exist on the surface of the second layer, and thus it is difficult to nitride the second layer in Step 3 (described later). The reason for this is that nitrogen couples with silicon but does not couple with carbon. So as to cause a desired nitriding reaction in Step 3 (described later), adsorption of $C_xH_y$ on the silicon-containing layer should not be saturated so that silicon can be exposed on the surface of the second layer.

Thereafter, the valve 243b of the second gas supply pipe 232b is closed to interrupt supply of $C_3H_6$ gas. At this time, in a state where the APC valve 244 of the exhaust pipe 231 is opened, the inside of the process chamber 201 is vacuum-evacuated by using the vacuum pump 246 so that $C_3H_6$ gas remaining in the process chamber 201 without participating in a reaction or after participating in the formation of the carbon-containing layer can be removed from the inside of the process chamber 201. Furthermore, at this time, in a state where the valve 243f is opened, supply of $N_2$ gas to the inside of the process chamber 201 is continued. Owing to this, $C_3H_6$ gas remaining in the process chamber 201 without participating in a reaction or after participating in the formation of the carbon-containing layer can be removed from the inside of the process chamber 201 more effectively.

As a carbon-containing gas, not only $C_3H_6$ gas, but also another gas such as $C_2H_4$ gas may be used.

[Step 3]

After removing gas remaining in the process chamber 201, the valve 243d of the fourth gas supply pipe 232d is opened to allow a flow of $NH_3$ gas through the fourth gas supply pipe 232d. The flowrate of the $NH_3$ gas flowing through the fourth gas supply pipe 232d is controlled by the MFC 241d. Then, the $NH_3$ gas is supplied to the inside of the buffer chamber 237 through the gas supply holes 250d of the fourth nozzle 249d. At this time, high-frequency power is not applied across the first rod-shaped electrode 269 and the second rod-shaped electrode 270. As a result, the $NH_3$ gas supplied to the inside of the buffer chamber 237 is activated by heat and is then supplied to the inside of the process chamber 201 through the gas supply holes 250e while being exhausted through the exhaust pipe 231. At this time, the valve 243h is also opened to allow a flow of $N_2$ gas through the inert gas supply pipe 232h. Then, together with the $NH_3$ gas, the $N_2$ gas is supplied to the inside of the process chamber 201 and is exhausted through the exhaust pipe 231.

When the $NH_3$ gas is activated by heat and is allowed to flow, the APC valve 244 is properly controlled so as to adjust the inside pressure of the process chamber 201, for example, in the range of 50 Pa to 3000 Pa. The flowrate of the $NH_3$ gas controlled by the MFC 241d is, for example, in the range of 100 sccm to 10000 sccm. The time during which the wafers 200 are exposed to the $NH_3$ gas, that is, gas supply time (exposing time) is in the range of, for example, 2 seconds to 120 seconds. At this time, like in Step 1, the temperature of the heater 207 is set to a predetermined temperature so that the temperature of the wafers 200 can be in the range of, for example, 300° C. to 650° C. Since it is difficult to make the $NH_3$ gas reactive at the above-mentioned temperature range of the wafers 200 due to a high reaction temperature of the $NH_3$ gas, the process chamber 201 is kept at a relatively high pressure as mentioned above so as to activate the $NH_3$ gas by heat. In the case where the $NH_3$ gas is activated by heat and is supplied, soft reaction can be caused for soft nitriding (described later).

At this time, gas flowing in the process chamber 201 is thermally-activated $NH_3$ gas, and neither DCS gas nor $C_3H_6$ gas flows in the process chamber 201. Therefore, without causing a vapor-phase reaction, the activated $NH_3$ gas reacts with a part of the layer including silicon and carbon, that is, a part of the second layer formed on each of the wafers 200 in Step 2. As a result, the second layer is nitrided and modified into a third layer including silicon (first element), carbon (second element), and nitrogen (third element), that is, into a silicon carbonitride (SiCN) layer.

At this time, as shown in section (C) of FIG. 9, the nitriding reaction of the second layer is not saturated. For example, in the case where a silicon layer constituted by several atomic layers is formed in Step 1 and a carbon-containing layer constituted by less than one atomic layer is formed in Step 2, a part of the surface layer (the surface atomic layer of the atomic layers) is nitrided. That is, a region (silicon exposed region) of the surface layer that can be nitrided is partially or entirely nitrided. In this case, so as not to entirely nitride the second layer, the nitriding of the second layer is performed under a non-saturated condition. Alternatively, according to conditions, the surface atomic layer and the next lower atomic layers among the atomic layers of the second layer can be nitrided; however, the case where only the surface atomic layer is nitrided is preferable because the composition ratio of the silicon carbonitride film can be controlled more easily. In addition, for example, in the case where a silicon layer constituted by one atomic layer or less than one atomic layer is formed in Step 1 and a carbon-containing layer constituted by less than one atomic layer is formed in Step 2, a part of the surface layer is nitrided in the same way. In this case, similarly, so as not to nitride the entire second layer, nitriding is performed in a condition where the nitriding reaction of the second layer is not saturated.

Thereafter, the valve 243d of the fourth gas supply pipe 232d is closed to interrupt the supply of $NH_3$ gas. At this time, in a state where the APC valve 244 of the exhaust pipe 231 is opened, the inside of the process chamber 201 is vacuum-evacuated by using the vacuum pump 246 so that $NH_3$ gas remaining in the process chamber 201 without participating in a reaction or after participating in the nitriding reaction can be removed from the inside of the process chamber 201. Furthermore, at this time, in a state where the valve 243h is opened, supply of $N_2$ gas to the inside of the process chamber 201 is continued. Owing to this, $NH_3$ gas remaining in the process chamber 201 without participating in a reaction or after participating in the nitriding reaction can be removed from the inside of the process chamber 201 more effectively.

As a nitrogen-containing gas, not only $NH_3$ gas but also another gas such as $N_2$ gas, $NF_3$ gas, or $N_3H_8$ gas may be used.

By setting the above-described Step 1 to Step 3 to one cycle and repeating this cycle at least once, a thin film includes silicon (first element), carbon (second element), and nitrogen (third element), that is, a silicon carbonitride (SiCN) film can be formed on each of the wafers 200 to a predetermined thickness. Preferably, the cycle may be repeated a plurality of times.

In Step 2, the pressure of the inside of the process chamber 201, or the pressure of the inside of the process chamber 201 and the gas supply time are controlled to be higher or longer than the pressure of the inside of the process chamber 201, or the pressure of the inside of the process chamber 201 and the gas supplying time in Step 2 when the silicon carbonitride film having a stoichiometric composition is formed. By controlling the process conditions in this way, as compared with the case where the silicon carbonitride film is formed to have the stoichiometric composition, carbon can be excessively supplied in Step 2 (refer to section (B) in FIG. 10). Therefore, owing to the excessive supply of carbon in Step 2, a region (silicon exposed region) of the second layer that can be nitrided in Step 3 is reduced. That is, as compared with the case where the silicon carbonitride film is formed to have the stoichiometric composition, an excessive number of carbon atoms are supplied in Step 2, and thus, in Step 3, the nitriding reaction of the second layer is restricted. In this way, the composition ratio of the silicon carbonitride (SiCN) film can be controlled in a manner such that carbon (C) is excessive as compare with nitrogen (N) in terms of the stoichiometric composition.

In the upper side of FIG. 10, schematic partial section views of a wafer are shown to explain reaction states of steps during which a SiCN film is formed to have a stoichiometric composition. In the lower side of FIG. 10, schematic partial section views of a wafer are shown to explain reaction states of steps during which carbon (C) is excessively supplied to form a SiCN film having excessive carbon (C) as compared with nitrogen (N) in terms of stoichiometric composition. Section (A) to section (C) of FIG. 10 illustrate reaction states of Step 1 to Step 3, respectively.

Alternatively, in Step 3, the pressure of the inside of the process chamber 201, or the pressure of the inside of the process chamber 201 and the gas supply time are controlled to be lower or shorter than the pressure of the inside of the process chamber 201, or the pressure of the inside of the process chamber 201 and the gas supplying time in Step 3 when the silicon carbonitride film having the stoichiometric composition is formed. By controlling the process conditions in this way, as compared with the case where the silicon carbonitride film is formed to have the stoichiometric composition, nitrogen can be insufficiently supplied in Step 3 (refer to section (C) in FIG. 11). Therefore, owing to the insufficient supply of nitrogen in Step 3, the nitriding reaction of the second layer is restricted in Step 3. That is, as compared with the case where the silicon carbonitride film is formed to have the stoichiometric composition, an insufficient number of nitrogen atoms are supplied in Step 3, and thus, in Step 3, the nitriding reaction of the second layer is restricted. In this way, the composition ratio of the silicon carbonitride (SiCN) film can be controlled in a manner such that carbon (C) is excessive as compare with nitrogen (N) in terms of the stoichiometric composition.

In the upper side of FIG. 11, schematic partial section views of a wafer are shown to explain reaction states of steps during which a SiCN film is formed to have a stoichiometric composition. In the lower side of FIG. 11, schematic partial section views of a wafer are shown to explain reaction states of steps during which nitrogen (N) is insufficiently supplied to form a SiCN film having excessive carbon (C) as compared with nitrogen (N) in terms of stoichiometric composition. Section (A) to section (C) of FIG. 11 illustrate reaction states of Step 1 to Step 3, respectively.

After a silicon carbonitride film having a predetermined composition and thickness is formed in the film-forming process, gas purge, replacement with inert gas, return to atmospheric pressure, boat unloading, and wafer discharging are performed in the same way as in the first sequence.

In the above-described example of the second sequence of the current embodiment, a silicon-containing gas, a carbon-containing gas, and a nitrogen-containing gas are respectively used as a first element-containing gas, a second element-containing gas, and a third element-containing gas, so as to form a SiCN film; however, the present invention is not limited to the example but various changes and modifications can be made within the scope and spirit of the present invention.

For example, a silicon-containing gas, a nitrogen-containing gas, and an oxygen-containing gas may be used as a first element-containing gas, a second element-containing gas, and a third element-containing gas, respectively, so as to form a silicon oxynitride (SiON) film; or a silicon-containing gas, a boron-containing gas, and a nitrogen-containing gas may be used as a first element-containing gas, a second element-containing gas, and a third element-containing gas, respectively, so as to form a silicon boron nitride (SiBN) film. In addition, for example, a boron-containing gas, a carbon-containing gas, and a nitrogen-containing gas may be used as a first element-containing gas, a second element-containing gas, and a third element-containing gas, respectively, so as to form a boron carbonitride (BCN) film; an aluminum-containing gas, a boron-containing gas, and a nitrogen-containing gas may be used as a first element-containing gas, a second element-containing gas, and a third element-containing gas, respectively, so as to form an aluminum boron nitride (AlBN) film; or a silicon-containing gas, a carbon-containing gas, and an oxygen-containing gas may be used as a first element-containing gas, a second element-containing gas, and a third element-containing gas, respectively, so as to form a silicon oxycarbide (SiOC) film. Furthermore, a titanium-containing gas, an aluminum-containing gas, and a nitrogen-containing gas may be used as a first element-containing gas, a second element-containing gas, and a third element-containing gas, respectively, so as to form a titanium aluminum nitride (TiAlN) film; or a silicon-containing gas, an aluminum-containing gas, and a nitrogen-containing gas may be used as a first element-containing gas, a second element-containing gas, and a third element-containing gas, respectively, so as to form a silicon aluminum nitride (SiAlN) film. In addition, gases such as exemplified in the description of the first sequence may also be used.

As explained above, according to the second sequence of the current embodiment, a semiconductor element such as silicon (Si) or boron (B), or a metal element such as aluminum (Al) or titanium (Ti) may be used as a first element; an element such as nitrogen (N), carbon (C), or oxygen (O), or a metal such as aluminum (Al) may be used as a second element; and an element such as nitrogen (N) or oxygen (O) may be used as a third element.

(Third Sequence)

Next, a third sequence will now be described according to an embodiment.

Figure 5:
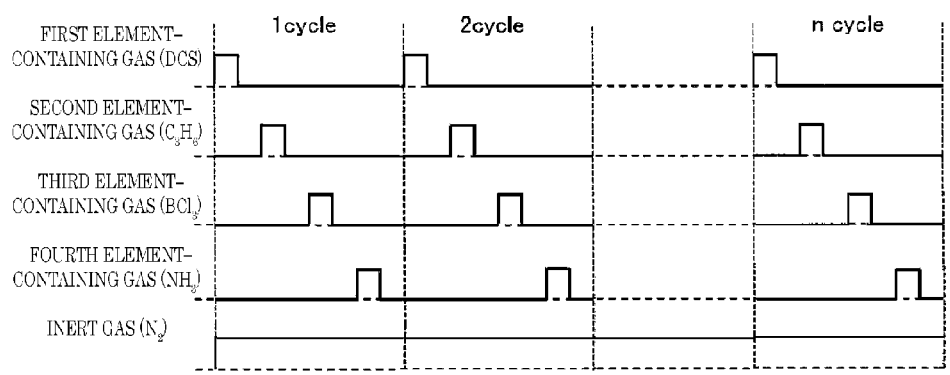
FIG. 5 is a view illustrating gas supply timing in a third sequence according to an embodiment of the present invention.
Figure 12:
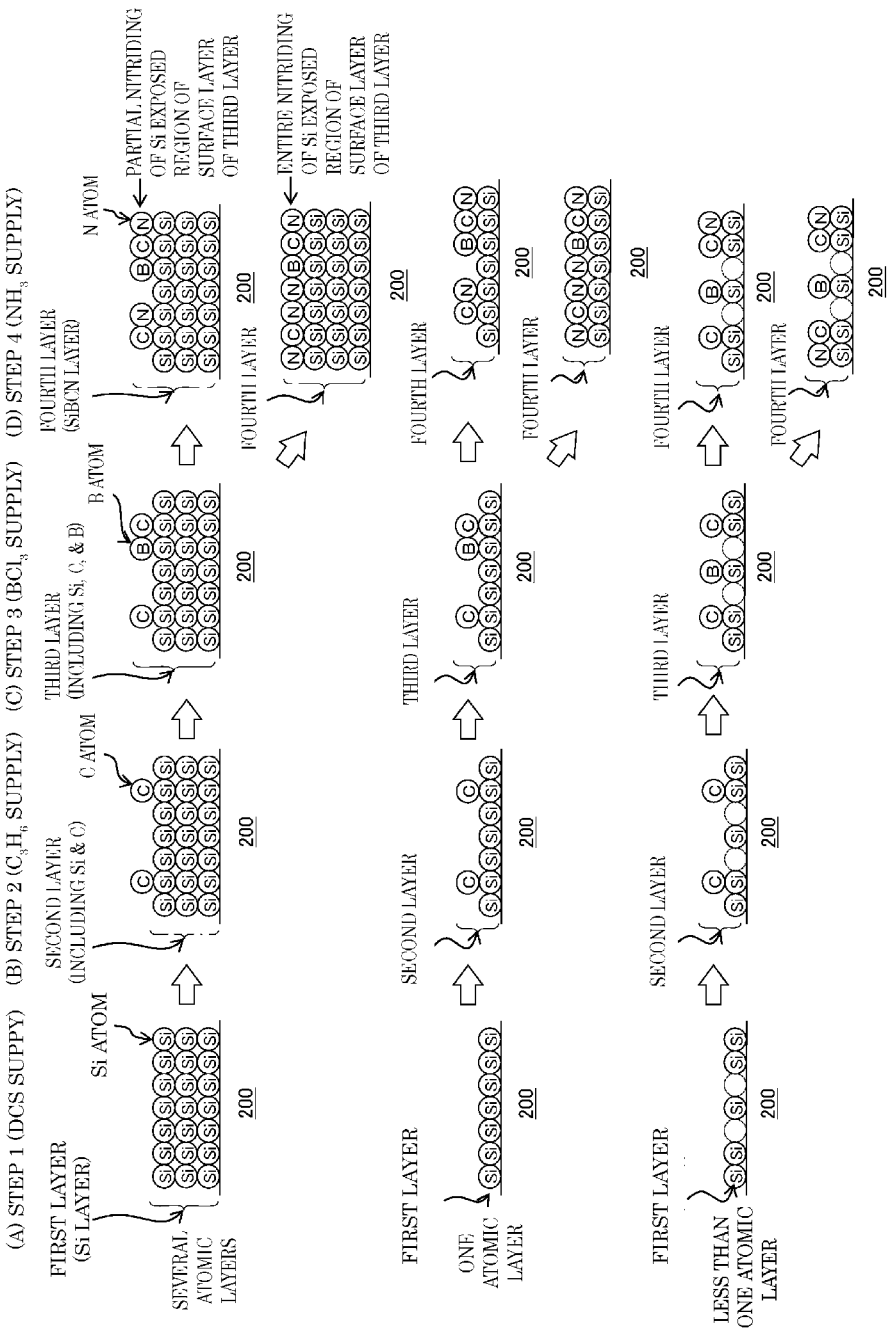
FIG. 12 is a schematic view illustrating formation of a silicon boron carbon nitride film on a wafer in the third sequence according to the embodiment of the present invention.
Figure 13:
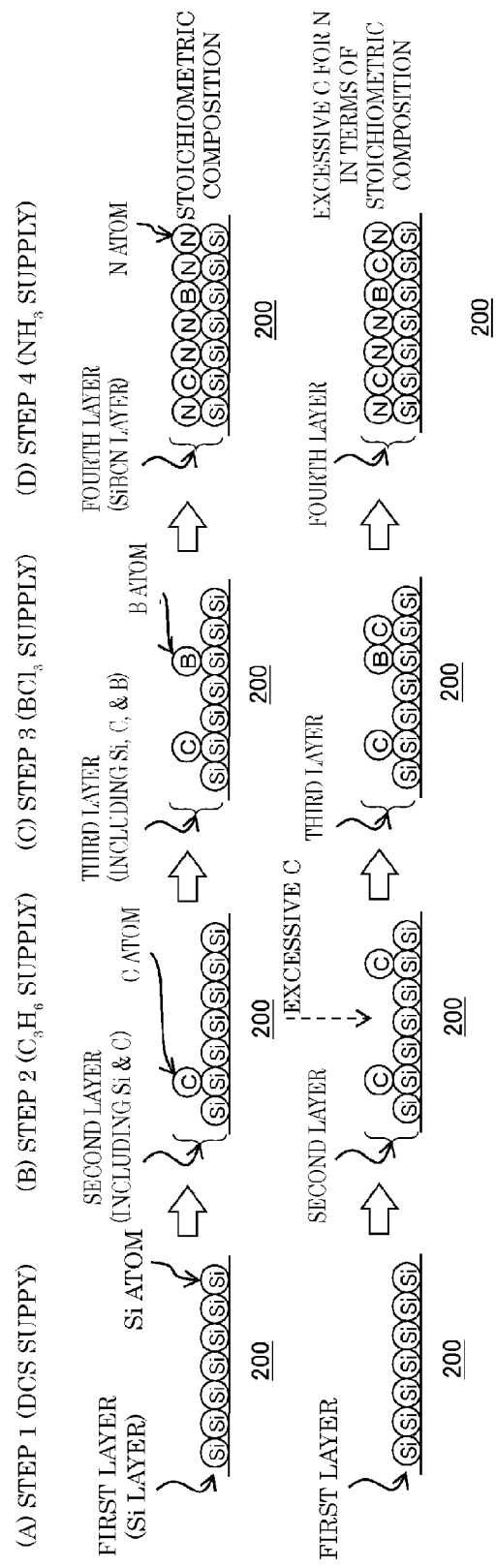
FIG. 13 is a schematic view illustrating a case where carbon is excessively supplied in Step 2 of the third sequence according to the embodiment of the present invention.
Figure 14:
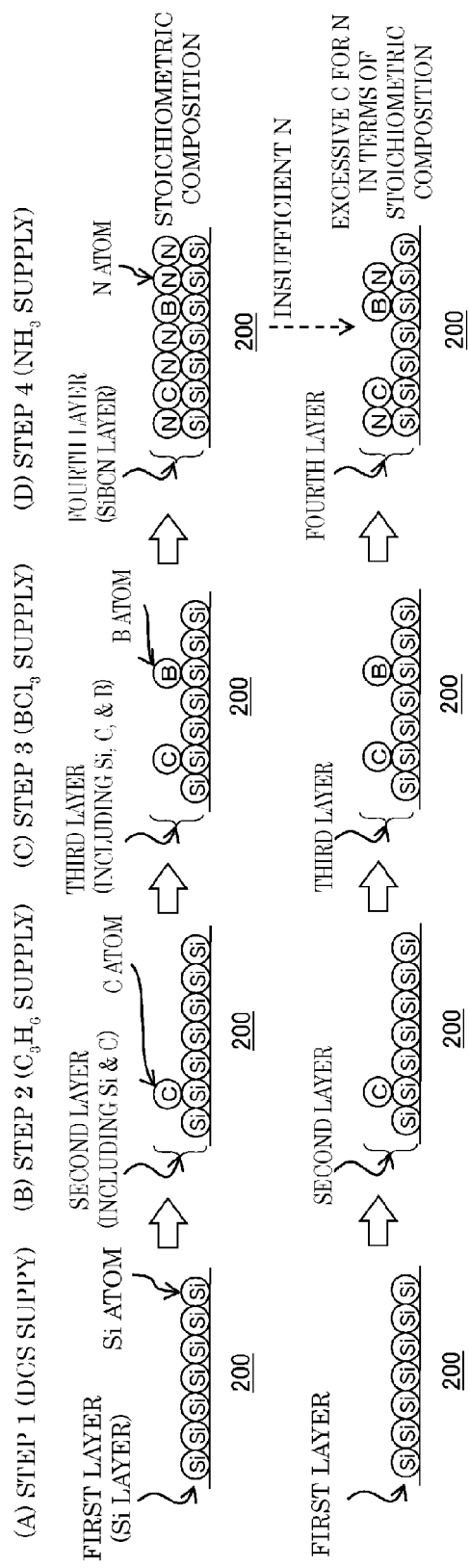
FIG. 14 is a schematic view illustrating a case where nitrogen is insufficiently supplied in Step 4 of the third sequence according to the embodiment of the present invention.

FIG. 5 is a view illustrating gas supply timing in the third sequence according to an embodiment of the present invention; FIG. 12 is a schematic view illustrating formation of a silicon boron carbon nitride film on a wafer in the third sequence according to the embodiment of the present invention; FIG. 13 is a schematic view illustrating a case where carbon is excessively supplied in Step 2 of the third sequence according to the embodiment of the present invention; and FIG. 14 is a schematic view illustrating a case where nitrogen is insufficiently supplied in Step 4 of the third sequence according to the embodiment of the present invention. The third sequence of the current embodiment relates to a method of controlling a composition ratio of four elements.

The third sequence of the current embodiment includes a process of forming a first layer including a first element on a wafer 200 by supplying a gas containing the first element (a first element-containing gas) to the inside of a process vessel in which the wafer 200 is accommodated;

a process of forming a second layer including the first element and a second element by supplying a gas containing the second element (second element-containing gas) to the inside of the process vessel, wherein the second layer is formed by forming a layer including the second element on the first layer, or the second layer is formed by modifying the first layer;

a process of forming a third layer including the first element, the second element, and a third element by supplying a gas containing the third element (the third element-containing gas) to the inside of the process vessel, wherein the third layer is formed by forming a layer including the third element on the second layer, or the third layer is formed by modifying the second layer; and a process of forming a fourth layer including the first to third elements and a fourth element by supplying a gas containing the fourth element (a fourth element-containing gas) to the inside of the process vessel to modify the third layer, wherein the process of forming the first layer, the process of forming the second layer, the process of forming the third layer, and the process of forming the fourth layer are set to one cycle, and the cycle is repeated at least once so as to form a thin film including the first to fourth elements and having a predetermined thickness.

In the third sequence, the pressure of the inside of the process vessel, or the pressure of the inside of the process vessel and the time of supplying the gas in one process of the process of forming of the first layer, the process of forming of the second layer, the process of forming of the third layer, and the process of forming of the fourth layer are controlled to be higher or longer than the pressure of the inside of the process vessel, or the pressure of the inside of the process vessel and the time of supplying the gas in the one process when the thin film having a stoichiometric composition is formed.

Alternatively, the pressure of the inside of the process vessel, or the pressure of the inside of the process vessel and the time of supplying the gas in the other process of the process of forming of the first layer, the process of forming of the second layer, the process of forming of the third layer, and the process of forming of the fourth layer are controlled to be lower or shorter than the pressure of the inside of the process vessel, or the pressure of the inside of the process vessel and the time of supplying the gas in the other process when the thin film having the stoichiometric composition is formed.

In this way, one of the elements of the thin film can be excessive as compared with the others in terms of the stoichiometric composition.

In the case of a thin film made of a four-element thin film, the stoichiometric composition is not unique unlike the case of a two-element thin film but is two or more like the case of a three-element thin film. In the third sequence of the current embodiment, a thin film is formed in a manner such that the thin film has a composition ratio different from any of the stoichiometric compositions.

The process of forming the first layer is the same as the process of forming the first layer in the second sequence. That is, things regarding the process of forming the first layer, such as process conditions, motivated reaction, layers, layer thickness, examples of the first element, examples of the first element-containing gas, and examples of the first layer, are the same as those regarding the process of forming the first layer in the second sequence.

The process of forming the second layer is the same as the process of forming the second layer in the second sequence. That is, things regarding the process of forming the second layer, such as process conditions, a gas activating method, motivated reaction, layers, examples of the second element, examples of the second element-containing gas, and examples of the second layer, are the same as those regarding the process of forming the second layer in the second sequence.

In the process of forming the third layer, the third element-containing gas is activated by plasma or heat and is then supplied, so that a layer including the third element and constituted by less than one to several atomic layers can be formed on the second layer or the second layer can be modified by reaction between a part of the second layer and the third element-containing gas. In this way, the third layer including the first to third elements is formed.

In the case where the third layer is formed by forming a layer including the third element on the second layer, the layer including the third element may be a third element layer or a third element-containing gas adsorption layer. The third element-containing gas adsorption layer includes an adsorption layer formed of a material decomposed from the third element-containing gas. The third element layer is a general term for a layer made of the third element, such as a continuous layer, a discontinuous layer, and a thin film in which such layers are overlapped. In addition, a continuous layer formed of the third element may also be called "a thin film." In addition, the third element-containing gas adsorption layer is a term including a continuous chemical adsorption layer and a discontinuous chemical adsorption layer that are formed of molecules of the third element-containing gas or molecules of a material decomposed from the third element-containing gas. Preferably, the layer including the third element may be a discontinuous chemical adsorption layer formed of molecules of the third element-containing gas or molecules of a material decomposed from the third element-containing gas, that is, the layer including the third element may be a chemical adsorption layer constituted by less than one atomic layer, so as to improve the controllability of the composition ratio of the thin film.

In the case where the third layer is formed by modifying the second layer, the second layer is modified by the same method as the method used for modifying the second layer in the process of forming the third layer in the second sequence.

The third element-containing gas may be supplied after being activated by plasma or heat. FIG. 5 illustrates an example where the third element-containing gas is supplied after being activated by heat, that is, an example for causing a soft reaction.

In the process of forming the fourth layer, the fourth element-containing gas is activated by plasma or heat and is then supplied to the third layer, so as to modify the third layer for forming the fourth layer including the first to fourth elements. For example, if the third layer is formed to have the first to third elements and be constituted by several atomic layers in the process of forming the third layer, the surface atomic layer of the several atomic layers may partially or entirely be allowed to react with the fourth element-containing gas. Alternatively, the surface atomic layer and the next lower atomic layers among the several atomic layers of the third layer formed of the first to third elements may be allowed to react with the fourth element-containing gas. However, in the case where the third layer is constituted by the several atomic layers including the first to third elements, it may be preferable that only the surface atomic layer of the third layer be modified because the composition ratio of the thin film can be controlled more easily. Preferably, the fourth element may be an element that cannot turn into solid by itself. The fourth element-containing gas may be supplied after being activated by plasma or heat. FIG. 5 illustrates an example where the fourth element-containing gas is supplied after being activated by heat, that is, an example of causing a soft reaction for performing a soft modification.

A method, such as a method of controlling the composition ratio of the thin film in a manner such that the first element is excessive as compared with the second element in terms of the stoichiometric composition, is the same as that used in the first sequence or the second sequence.

A method, such as a method of controlling the composition ratio of the thin film in a manner such that the second element is excessive as compared with the third element in terms of the stoichiometric composition or the third element is excessive as compared with the second element in terms of the stoichiometric composition, is the same as that used in the second sequence.

In the case where the composition ratio of the thin film is controlled in a manner such that the second or third element is excessive as compared with the fourth element in terms of the stoichiometric composition or the fourth element is excessive as compared with the second or third element in terms of the stoichiometric composition, the composition ratio is controlled based on one of the elements.

For example, in the case where the composition ratio of the thin film is controlled in a manner such that the second element is excessive as compared with the fourth element in terms of the stoichiometric composition, the pressure of the inside of the process vessel, or the pressure of the inside of the process vessel and the time of supplying the gas in the process of forming the second layer are controlled to be higher or longer than the pressure of the inside of the process vessel, or the pressure of the inside of the process vessel and the time of supplying the gas in the process of forming the second layer when the thin film having the stoichiometric composition is formed. By controlling the process conditions in this way, as compared with the case where the thin film is formed to have the stoichiometric composition, the second element can be excessively supplied in the process of forming the second layer. Therefore, owing to the excessive supply of the second element in the process of forming the second layer, a region of the third layer that can be modified in the process of forming the fourth layer is reduced. That is, as compared with the case where the thin film is formed to have the stoichiometric composition, an excessive number of atoms of the second element are supplied in the process of forming the second layer, and thus, in the process of forming the fourth layer, the modification reaction of the third layer can be restricted.

Alternatively, the pressure of the inside of the process vessel, or the pressure of the inside of the process vessel and the time of supplying the gas in the process of forming the fourth layer are controlled to be lower or shorter than the pressure of the inside of the process vessel, or the pressure of the inside of the process vessel and the time of supplying the gas in the process of forming the fourth layer when the thin film having the stoichiometric composition is formed. By controlling the process conditions in this way, as compared with the case where the thin film is formed to have the stoichiometric composition, the fourth element can be insufficiently supplied in the process of forming the fourth layer. Therefore, owing to the insufficient supply of the fourth element in the process of forming the fourth layer, the modification reaction of the third layer can be restricted in the process of forming the fourth layer. That is, as compared with the case where the thin film is formed to have the stoichiometric composition, an insufficient number of atoms of the fourth element are supplied in the process of forming the fourth layer, and thus, in the process of forming the fourth layer, the modification reaction of the third layer can be restricted.

In addition, for example, in the case where the composition ratio of the thin film is controlled in a manner such that the fourth element is excessive as compared with the second element in terms of the stoichiometric composition, the pressure of the inside of the process vessel, or the pressure of the inside of the process vessel and the time of supplying the gas in the process of forming of the second layer are controlled to be lower or shorter than the pressure of the inside of the process vessel, or the pressure of the inside of the process vessel and the time of supplying the gas in the process of the second layer when the thin film having the stoichiometric composition is formed. By controlling the process conditions in this way, as compared with the case where the thin film is formed to have the stoichiometric composition, the second element can be insufficiently supplied in the process of forming the second layer. Therefore, owing to the insufficient supply of the second element in the process of forming the second layer, a layer including the second element is formed in a smaller region or modification reaction of the first layer is restricted. As a result, the fourth element becomes excessive as compared with the second element in terms of the stoichiometric composition.

If the second element is insufficiently supplied in the process of forming the second layer, a region of the third layer that can be modified in the process of forming the fourth layer is increased. In this case, if the pressure of the inside of the process vessel, or the pressure of the inside of the process vessel and the time of supplying the gas in the process of forming the fourth layer are controlled to be higher or longer than the pressure of the inside of the process vessel, or the pressure of the inside of the process vessel and the time of supplying the gas in the process of forming the fourth layer when the thin film having the stoichiometric composition is formed, the fourth element can be excessively supplied in the process of forming the fourth layer, and thus the fourth element can be controlled to be much excessive as compared with the second element in terms of the stoichiometric composition. That is, by a combination of insufficient supply of the second element in the process of forming the second layer and excessive supply of the fourth element in the process of forming the fourth layer, the modification reaction of the third layer can be facilitated in the process of forming the fourth layer, and thus the composition ratio of the thin film can be controlled in a manner such that the fourth element is much excessive as compared with the second element in terms of the stoichiometric composition.

Hereinafter, the third sequence of the current embodiment will be described more specifically. In the following description, an explanation will be given on an example where a silicon boron carbon nitride (SiBCN) film is formed on a substrate as an insulating film according to the sequence shown in FIG. 5 under the conditions where silicon (Si) is a first element, carbon (C) is a second element, boron (B) is a third element, nitrogen (N) is a fourth element, DCS gas which is a silicon-containing gas is used as a first element-containing gas, $C_3H_6$ gas which is a carbon-containing gas is used as a second element-containing gas, $BCl_3$ gas which is a boron-containing gas is used as a third element-containing gas, and $NH_3$ gas which is a nitrogen-containing gas is used as a fourth element-containing gas. Furthermore, in the following description of the example, the composition ratio of the silicon boron carbon nitride film is controlled such that carbon (C) is excessive as compared with nitrogen (N) in terms of the stoichiometric composition. In addition, in the example, the first gas supply system constitutes a silicon-containing gas supply system (first element-containing gas supply system), the second gas supply system constitutes a carbon-containing gas supply system (second element-containing gas supply system), the third gas supply system constitutes a boron-containing gas supply system (third element-containing gas supply system), and the fourth gas supply system constitutes a nitrogen-containing gas supply system (fourth element-containing gas supply system).

Wafer charging, boat loading, pressure adjustment, temperature adjustment, and wafer rotation are performed in the same way as in the second sequence, and then, the following four steps are sequentially performed.

[Step 1]

Step 1 is performed in the same way as Step 1 of the second sequence. That is, things regarding Step 1, such as process conditions, motivated reaction, layers, layer thickness, examples of the first element, examples of the first element-containing gas, and examples of the first layer, are the same as those regarding Step 1 of the second sequence (refer to section (A) of FIG. 12).

[Step 2]

Step 2 is performed in the same way as Step 2 of the second sequence. That is, things regarding Step 2, such as process conditions, a gas activating method, motivated reaction, layers, examples of the second element, examples of the second element-containing gas, and examples of the second layer, are the same as those regarding Step 2 of the second sequence (refer to section (B) of FIG. 12).

[Step 3]

After completing Step 2 and removing gas remaining in the process chamber 201, the valve 243c of the third gas supply pipe 232c is opened to allow a flow of $BCl_3$ gas through the third gas supply pipe 232c. The flowrate of the $BCl_3$ gas flowing through the third gas supply pipe 232c is controlled by the MFC 241c. Then, the $BCl_3$ gas is supplied to the inside of the process chamber 201 through the gas supply holes 250c of the third nozzle 249c and is exhausted through the exhaust pipe 231. At this time, the valve 243g is also opened to allow a flow of $N_2$ gas through the inert gas supply pipe 232g. The $N_2$ gas is supplied to the inside of the process chamber 201 together with the $BCl_3$ gas and is exhausted through the exhaust pipe 231.

At this time, the APC valve 244 is properly controlled so as to adjust the inside pressure of the process chamber 201, for example, in the range of 50 Pa to 3000 Pa. The flowrate of the $BCl_3$ gas controlled by the MFC 241c is, for example, in the range of 100 sccm to 10000 sccm. The time during which wafers 200 are exposed to the $BCl_3$ gas, that is, gas supply time (exposing time) is in the range of, for example, 2 seconds to 120 seconds. At this time, like in Step 1, the temperature of the heater 207 is set to a predetermined temperature so that the temperature of the wafers 200 can be in the range of, for example, 300° C. to 650° C. In the case where the $BCl_3$ gas is activated by heat and is supplied, soft reaction can be caused, and thus a boron-containing layer can be easily formed (described later).

At this time, gas flowing in the process chamber 201 is $BCl_3$ gas activated by heat and neither DCS gas nor $C_3H_6$ gas flows in the process chamber 201. Therefore, without causing a vapor-phase reaction, the $BCl_3$ gas which is in an activated state is supplied to the wafers 200, and at this time, as shown in section (C) of FIG. 12, a boron-containing layer constituted by less than one atomic layer, that is, a discontinuous boron-containing layer, is formed on a layer which includes silicon and carbon and is formed on each of the wafer 200 as a second layer in Step 2. In this way, a third layer including silicon (first element), carbon (second element), and boron (third element) is formed. In some cases, according to conditions, a part of the second layer reacts with the $BCl_3$ gas, and as a result, the second layer is modified (boronized) to form a third layer including silicon, nitrogen, and boron.

The boron-containing layer formed on the second layer may be a boron layer (B-layer), a chemical adsorption layer of $BCl_3$, or a chemical adsorption layer of $B_xCl_y$ (a material decomposed from $BCl_3$). Since boron does not couple with carbon although it couples with silicon, the boron layer is a discontinuous layer of boron, and the chemical adsorption layer of $BCl_3$ or $B_xCl_y$ is a discontinuous chemical adsorption layer formed of $BCl_3$ molecules or $B_xCl_y$ molecules.

Thereafter, the valve 243c of the third gas supply pipe 232c is closed to interrupt supply of $BCl_3$ gas. At this time, in a state where the APC valve 244 of the exhaust pipe 231 is opened, the inside of the process chamber 201 is vacuum-evacuated by using the vacuum pump 246 so that $BCl_3$ gas remaining in the process chamber 201 without participating in a reaction or after participating in the formation of the boron-containing layer can be removed from the inside of the process chamber 201. Furthermore, at this time, in a state where the valve 243g is opened, supply of $N_2$ gas to the inside of the process chamber 201 is continued. Owing to this, $BCl_3$ gas remaining in the process chamber 201 without participating in a reaction or after participating in the formation of the boron-containing layer can be removed from the inside of the process chamber 201 more effectively.

As a boron-containing gas, not only $BCl_3$ gas, but also another gas such as $B_2H_6$ gas may be used.

[Step 4]

After removing gas remaining in the process chamber 201, the valve 243d of the fourth gas supply pipe 232d is opened to allow a flow of $NH_3$ gas through the fourth gas supply pipe 232d. The flowrate of the $NH_3$ gas flowing through the fourth gas supply pipe 232d is controlled by the MFC 241d. Then, the $NH_3$ gas is supplied to the inside of the buffer chamber 237 through the gas supply holes 250d of the fourth nozzle 249d. At this time, high-frequency power is not applied across the first rod-shaped electrode 269 and the second rod-shaped electrode 270. As a result, the $NH_3$ gas supplied to the inside of the buffer chamber 237 is activated by heat and is then supplied to the inside of the process chamber 201 through the gas supply holes 250e while being exhausted through the exhaust pipe 231. At this time, the valve 243h is also opened to allow a flow of $N_2$ gas through the inert gas supply pipe 232h. Then, together with the $NH_3$ gas, the $N_2$ gas is supplied to the inside of the process chamber 201 and is exhausted through the exhaust pipe 231.

When the $NH_3$ gas is activated by heat and is allowed to flow, the APC valve 244 is properly controlled so as to adjust the inside pressure of the process chamber 201, for example, in the range of 50 Pa to 3000 Pa. The flowrate of the $NH_3$ gas controlled by the MFC 241d is, for example, in the range of 100 sccm to 10000 sccm. The time during which the wafers 200 are exposed to the $NH_3$ gas, that is, gas supply time (exposing time) is in the range of, for example, 2 seconds to 120 seconds. At this time, like in Step 1, the temperature of the heater 207 is set to a predetermined temperature so that the temperature of the wafers 200 can be in the range of, for example, 300° C. to 650° C. Since it is difficult to make the $NH_3$ gas reactive at the above-mentioned temperature range of the wafers 200 due to a high reaction temperature of the $NH_3$ gas, the process chamber 201 is kept at a relatively high pressure as mentioned above so as to activate the $NH_3$ gas by heat. In the case where the $NH_3$ gas is activated by heat and is supplied, soft reaction can be caused for soft nitriding (described later).

At this time, gas flowing in the process chamber 201 is thermally-activated $NH_3$ gas, and neither DCS gas nor $C_3H_6$ gas flows in the process chamber 201. Therefore, without causing a vapor-phase reaction, the activated $NH_3$ gas reacts with a part of the layer including silicon, carbon, and boron, that is, a part of the third layer formed on each of the wafers 200 in Step 3. As a result, the third layer is nitrided and modified into a fourth layer including silicon (first element), carbon (second element), boron (third element), and nitrogen (fourth element), that is, into a silicon boron carbon nitride (SiBCN) layer.

At this time, as shown in section (D) of FIG. 12, the nitriding reaction of the third layer is not saturated. For example, in the case where a silicon layer constituted by several atomic layers is formed in Step 1, a carbon-containing layer constituted by less than one atomic layer is formed in Step 2, and a boron-containing layer constituted by less than one atomic layer is formed in Step 3, a part of the surface layer (the surface atomic layer of the atomic layers) is nitrided. That is, a region (silicon exposed region) of the surface layer that can be nitrided is partially or entirely nitrided. In this case, so as not to entirely nitride the third layer, the nitriding of the third layer is performed under a non-saturated condition. Alternatively, according to conditions, the surface atomic layer and the next lower atomic layers among the atomic layers of the third layer can be nitrided; however, the case where only the surface atomic layer is nitrided is preferable because the composition ratio of the silicon boron carbon nitride film can be controlled more easily. In addition, for example, in the case where a silicon layer constituted by one atomic layer or less than one atomic layer is formed in Step 1, a carbon-containing layer constituted by less than one atomic layer is formed in Step 2, and a boron-containing layer constituted by less than one atomic layer is formed in Step 3, a part of the surface layer is nitrided in the same way. In this case, similarly, so as not to nitride the entire third layer, nitriding is performed in a condition where the nitriding reaction of the third layer is not saturated.

Thereafter, the valve 243d of the fourth gas supply pipe 232d is closed to interrupt the supply of $NH_3$ gas. At this time, in a state where the APC valve 244 of the exhaust pipe 231 is opened, the inside of the process chamber 201 is vacuum-evacuated by using the vacuum pump 246 so that $NH_3$ gas remaining in the process chamber 201 without participating in a reaction or after participating in the nitriding reaction can be removed from the inside of the process chamber 201. Furthermore, at this time, in a state where the valve 243h is opened, supply of $N_2$ gas to the inside of the process chamber 201 is continued. Owing to this, $NH_3$ gas remaining in the process chamber 201 without participating in a reaction or after participating in the nitriding reaction can be removed from the inside of the process chamber 201 more effectively.

As a nitrogen-containing gas, not only $NH_3$ gas but also another gas such as $N_2$ gas, $NF_3$ gas, or $N_3H_8$ gas may be used.

By setting the above-described Step 1 to Step 4 to one cycle and repeating this cycle at least once, a thin film includes silicon (first element), carbon (second element), boron (third element), and nitrogen (fourth element), that is, a silicon boron carbon nitride (SiBCN) film can be formed on each of the wafers 200 to a predetermined thickness. Preferably, the cycle may be repeated a plurality of times.

In Step 2, the pressure of the inside of the process chamber 201, or the pressure of the inside of the process chamber 201 and the gas supply time are controlled to be higher or longer than the pressure of the inside of the process chamber 201, or the pressure of the inside of the process chamber 201 and the gas supplying time in Step 2 when the silicon boron carbon nitride film having a stoichiometric composition is formed. By controlling the process conditions in this way, as compared with the case where the silicon boron carbon nitride film is formed to have the stoichiometric composition, carbon can be excessively supplied in Step 2 (refer to section (B) in FIG. 13). Therefore, owing to the excessive supply of carbon in Step 2, a region (silicon exposed region) of the third layer that can be nitrided in Step 4 is reduced. That is, as compared with the case where the silicon boron carbon nitride film is formed to have the stoichiometric composition, an excessive number of carbon atoms are supplied in Step 2, and thus, in Step 4, the nitriding reaction of the third layer is restricted. In this way, the composition ratio of the silicon boron carbon nitride (SiBCN) film can be controlled in a manner such that carbon (C) is excessive as compare with nitrogen (N) in terms of the stoichiometric composition.

In the upper side of FIG. 13, schematic partial section views of a wafer are shown to explain reaction states of steps during which a SiBCN film is formed to have a stoichiometric composition. In the lower side of FIG. 13, schematic partial section views of a wafer are shown to explain reaction states of steps during which carbon (C) is excessively supplied to form a SiBCN film having excessive carbon (C) as compared with nitrogen (N) in terms of stoichiometric composition. Section (A) to section (D) of FIG. 13 illustrate reaction states of Step 1 to Step 4, respectively.

Alternatively, in Step 4, the pressure of the inside of the process chamber 201, or the pressure of the inside of the process chamber 201 and the gas supply time are controlled to be lower or shorter than the pressure of the inside of the process chamber 201, or the pressure of the inside of the process chamber 201 and the gas supplying time in Step 4 when the silicon boron carbon nitride film having a stoichiometric composition is formed. By controlling the process conditions in this way, as compared with the case where the silicon boron carbon nitride film is formed to have the stoichiometric composition, nitrogen can be insufficiently supplied in Step 4. Therefore, owing to the insufficient supply of nitrogen in Step 4, the nitriding reaction of the third layer is restricted in Step 4. That is, as compared with the case where the silicon boron carbon nitride film is formed to have the stoichiometric composition, an insufficient number of nitrogen atoms are supplied in Step 4, and thus, in Step 4, the nitriding reaction of the third layer is restricted. In this way, the composition ratio of the silicon boron carbon nitride (SiBCN) film can be controlled in a manner such that carbon (C) is excessive as compare with nitrogen (N) in terms of the stoichiometric composition.

In the upper side of FIG. 14, schematic partial section views of a wafer are shown to explain reaction states of steps during which a SiBCN film is formed to have a stoichiometric composition. In the lower side of FIG. 14, schematic partial section views of a wafer are shown to explain reaction states of steps during which nitrogen (N) is insufficiently supplied to form a SiBCN film having excessive carbon (C) as compared with nitrogen (N) in terms of stoichiometric composition. Section (A) to section (D) of FIG. 14 illustrate reaction states of Step 1 to Step 4, respectively.

After a silicon boron carbon nitride film having a predetermined composition and thickness is formed in the film-forming process, gas purge, replacement with inert gas, return to atmospheric pressure, boat unloading, and wafer discharging are performed in the same way as in the second sequence.

In the above-described example of the third sequence of the current embodiment, a silicon-containing gas, a carbon-containing gas, a boron-containing gas, and a nitrogen-containing gas are respectively used as a first element-containing gas, a second element-containing gas, a third element-containing gas, and a fourth element-containing gas, so as to form a SiBCN film; however, the present invention is not limited to the example but various changes and modifications can be made within the scope and spirit of the present invention.

For example, a silicon-containing gas, a carbon-containing gas, an oxygen-containing gas, and a nitrogen-containing gas may be used as a first element-containing gas, a second element-containing gas, a third element-containing gas, and a first element-containing gas, respectively, so as to form a silicon oxygen carbon nitride (SiOCN) film. In this case, alternatively, a nitrogen-containing gas and an oxygen-containing gas may be used as a third element-containing gas and a first element-containing gas, respectively. In addition, for example, a silicon-containing gas, an aluminum-containing gas, a titanium-containing gas, and a nitrogen-containing gas may be used as a first element-containing gas, a second element-containing gas, a third element-containing gas, and a first element-containing gas, respectively, so as to form a silicon aluminum titanium nitride (SiAlTiN) film. Furthermore, for example, a silicon-containing gas, a carbon-containing gas, a silicon-containing gas, and a nitrogen-containing gas may be used as a first element-containing gas, a second element-containing gas, a third element-containing gas, and a first element-containing gas, respectively, so as to form a silicon carbonitride (SiCN). In this way, a three-element thin film can be formed. That is, for example, by using the same gas as the first element-containing gas and the third element-containing gas, the third sequence can be used for forming a three-element thin film. In addition, gases such as exemplified in the description of the first sequence may also be used.

In the third sequence of the current embodiment, a semiconductor element such as silicon (Si) or boron (B), or a metal element such as aluminum (Al) or titanium (Ti) may be used as a first element; an element such as nitrogen (N), boron (B), carbon (C), or oxygen (O), or a metal element such as aluminum (Al) or titanium (Ti) may be used as a second element or a third element; and an element such as nitrogen (N) or oxygen (O) may be used as a fourth element.

In a conventional CVD method, a plurality of kinds of gases including a plurality of elements constituting a thin film to be formed are simultaneously supplied. In this case, so as to control the composition ratio of a thin film to be formed, for example, the ratio of gas supply flowrates may be controlled when gases are supplied. In this case, although supply conditions such as the temperature of a substrate, the pressure of the inside of a process chamber, and gas supply time are adjusted when gases are supplied, the composition ratio of the thin film is not controlled.

Furthermore, in the case of an ALD method, a plurality of kinds of gases including a plurality of elements constituting a thin film to be formed are supplied in turns. In this case, so as to control the composition ratio of a thin film to be formed, for example, gas supply flowrate and gas supply time may be controlled when each gas is supplied. In the ALD method, a source gas is supplied to a substrate for the purpose of saturating adsorption of the source gas on the substrate, and thus, pressure control is unnecessary for the inside of a process chamber. That is, since saturation of source gas adsorption occurs at a pressure equal to or lower than a predetermined pressure at which the source gas is adsorbed for a given reaction temperature, only if the pressure of the inside of the process chamber is kept equal to or lower than the predetermined pressure, adsorption of the source gas can be saturated at any pressures in the range.

Therefore, generally, in a film-forming process performed by an ALD method, the inside pressure of a process chamber is allowed to be determined according to the exhausting ability of a substrate processing apparatus in relation with the amount of supplied gas. However, if it is configured to vary the inside pressure of a process chamber, chemical adsorption of a source gas on the surface of a substrate may be hindered, or reaction may become similar to CVD reaction, thereby making it difficult to perform a film-forming process by an ALD method. In addition, since an ALD reaction (adsorption saturation, surface reaction) is repeatedly performed so as to form a thin film to a predetermined thickness by an ALD method, if the ALD reaction is not sufficiently performed to a saturation level in each iteration, deposition may also be insufficient, and a sufficient deposition rate cannot be obtained. Therefore, in the case of an ALD method, it is difficult to control the composition ratio of a thin film by controlling the inside pressure of a process chamber.

However, according to the embodiments of the present invention, in any one of the first sequence, the second sequence, and the third sequence, a plurality of kinds of gases including a plurality of elements constituting a thin film to be formed are alternately supplied under conditions where CVD reaction is caused; and the pressure of the inside of the process chamber, or the pressure of the inside of the process chamber and the gas supply time are controlled in each step, so as to control the composition ratio of the thin film.

In the case where the composition ratio of a thin film is controlled by controlling the pressure of the inside of the process chamber in each step, influence of mechanical deviation between different substrate processing apparatuses can be reduced. That is, by using the same control method among different substrate processing apparatuses, the composition ratio of thin films can be equally controlled. In this case, if gas supply time is also controlled in each step, the composition ratio of a thin film can be finely controlled, and thus the controllability of the composition ratio of a thin film can be improved. Furthermore, by controlling the pressure of the inside of the process chamber in each step, the composition ratio of a thin film can be controlled while increasing the film-forming rate. That is, by controlling the pressure of the inside of the process chamber, the composition ratio of a thin film can be controlled, for example, while increasing the growth rate of a silicon-containing layer in Step 1 of each sequence. As explained above, according to the embodiments of the present invention, although a different substrate processing apparatus is used, the composition ratio of a thin film can be equally controlled by using the same control method, and thus the controllability of the composition ratio of a thin film can be improved, and furthermore, the film-forming rate, that is, productivity can be improved.

In a film-forming process by an ALD method, if the composition ratio of a thin film is controlled by adjusting the supply flowrate or supply time of gas in each step, the influence of mechanical deviation among different substrate processing apparatuses is increased. That is, although the same control is performed among different substrate processing apparatuses, the composition ratio of a thin film is not equally controlled. For example, although the supply flowrate and time of gas are set to the same values for different substrate processing apparatuses, the inside pressures of process chambers are not equal due to mechanical deviation. Therefore, since the inside pressures of the process chambers are different from one substrate processing apparatus to another, control for a desired composition ratio cannot be performed in the same manner among different substrate processing apparatuses. In addition, if the inside pressure of the process chamber is varied from one substrate processing apparatus to another, chemical adsorption of a source gas on the surface of a substrate may be hindered, or reaction may become similar to CVD reaction, thereby making it difficult to perform a film-forming process properly according to an ALD method.

First Example

Next, a first example will be described.

By using silicon (Si) as a first element and nitrogen (N) as a second element, a silicon nitride (SiN) film was formed while controlling the composition ratio of the silicon nitride film according to the first sequence of the embodiment, and then, the composition ratio was measured. DCS gas was used as a first element-containing gas, and $NH_3$ gas was used as a second element-containing gas. The composition ratio control was performed by adjusting pressure or gas supply time (exposing time) which is a composition ratio control factor. As pressure or gas supply time was increased, reaction was increased, and thus the thickness of a layer was increased in a corresponding process. That is, a more amount of a substance (more atoms) was supplied in the process. However, if a reactive species of which the adsorption or reaction could be saturated was used, in some cases, the thickness of the layer might not be increased equal to or greater than, for example, that of one atomic layer.

First, a silicon nitride ($Si_3N_4$) film having standard stoichiometric composition (N/Si≈1.33) was formed on a wafer. At that time, process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 532 Pa (4 Torr)
Flowrate of $NH_3$ gas: 9 slm
Exposing time to $NH_3$ gas: 24 seconds By adjusting process conditions based on the above-listed standard process conditions, it was tried to form a silicon nitride ($Si_4N_4$) film having a composition ratio of N/Si≈1.

By changing the exposing time to DCS gas from 12 seconds to 48 seconds in the first step, a $Si_4N_4$ film having a high silicon content could be formed. That is, by increasing the exposing time to DCS gas longer than that of the standard process conditions in the first step, a $Si_4N_4$ film having a high silicon content could be formed. Except for the exposing time to DCS gas in the first step, other process conditions were set equal to the standard process conditions. That is, the process conditions were set as follows.

(First Step)
Temperature in process chamber: 630° C.
Pressure in process chamber: 133 Pa (1 Torr)
Flowrate of DCS gas: 1 slm
Exposing time to DCS gas: 48 seconds
(Second Step)
Temperature in process chamber: 630° C.
Pressure in process chamber: 532 Pa (4 Torr)
Flowrate of $NH_3$ gas: 9 slm
Exposing time to $NH_3$ gas: 24 seconds Alternatively, by changing the pressure inside the process chamber from 133 Pa (1 Torr) to 266 Pa (2 Torr) in the first step, a $Si_4N_4$ film having a high silicon content could be formed. That is, by increasing the pressure inside the process chamber higher than that of the standard process conditions in the first step, a $Si_4N_4$ film having a high silicon content could be formed. Except for the pressure inside the process chamber in the first step, other process conditions were set equal to the standard process conditions. That is, the process conditions were set as follows.

(First Step)
Temperature in process chamber: 630° C.
Pressure in process chamber: 266 Pa (2 Torr)
Flowrate of DCS gas: 1 slm
Exposing time to DCS gas: 12 seconds
(Second Step)
Temperature in process chamber: 630° C.
Pressure in process chamber: 532 Pa (4 Torr)
Flowrate of $NH_3$ gas: 9 slm
Exposing time to $NH_3$ gas: 24 seconds Alternatively, by changing the exposing time to $NH_3$ gas from 24 seconds to 6 seconds in the second step, a $Si_4N_4$ film having a relatively high silicon content could be formed because the nitrogen content was reduced. That is, by decreasing the exposing time to $NH_3$ gas shorter than that of the standard process conditions in the second step, a $Si_4N_4$ film having a high silicon content could be formed. Except for the exposing time to $NH_3$ in the second step, other process conditions were set equal to the standard process conditions. That is, the process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 532 Pa (4 Torr)
Flowrate of $NH_3$ gas: 9 slm
Exposing time to $NH_3$ gas: 6 seconds Alternatively, by changing the pressure inside the process chamber from 532 Pa (4 Torr) to 133 Pa (1 Torr) in the second step, similarly, a $Si_4N_4$ film having a high silicon content could be formed. That is, by decreasing the pressure inside the process chamber lower than that of the standard process conditions in the second step, a $Si_4N_4$ film having a high silicon content could be formed. That is, the process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 133 Pa (1 Torr)
Flowrate of $NH_3$ gas: 9 slm
Exposing time to $NH_3$ gas: 24 seconds By changing the Si/N composition ratio of a silicon nitride film as described in the example, the charge density (film property) of the silicon nitride film can be controlled, and thus the silicon nitride film can be used as a charge trapping film of a flash memory. In addition, by changing the Si/N composition ratio of a silicon nitride film as described in the example, the optical refractive index or absorption coefficient of the silicon nitride film can be controlled, and thus the silicon nitride film can be used as an antireflection film in a lithograph process.

Second Example

Next, a second example will be described.

By using silicon (Si) as a first element, carbon (C) as a second element, and nitrogen (N) as a third element, a silicon carbonitride (SiCN) film was formed while controlling the composition ratio of the silicon carbonitride film according to the second sequence of the embodiment, and then, the composition ratio was measured. DCS gas was used as a first element-containing gas, $C_3H_6$ gas was used as a second element-containing gas, and $NH_3$ gas was used as a third element-containing gas. The composition ratio control was performed by adjusting pressure or gas supply time (exposing time) which is a composition ratio control factor. Like in the case of controlling the composition ratio of a two-element film, when the composition ratio of a three-element film was controlled, as pressure or gas supply time was increased, reaction was increased, and thus the thickness of a layer was increased in a corresponding process. That is, more atoms were supplied in the process. However, if a reactive species of which the adsorption or reaction could be saturated was used, in some cases, the thickness of the layer might not be increased equal to or greater than, for example, that of one atomic layer.

First, a silicon carbonitride film having a standard composition (8 atom % of carbon) was formed on a wafer. At that time, process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 133 Pa (1 Torr)
Flowrate of $C_3H_6$ gas: 1 slm
Exposing time to $C_3H_6$ gas: 8 seconds
(Third Step)
Temperature in process chamber: 630° C.
Pressure in process chamber: 931 Pa (7 Torr)
Flowrate of $NH_3$ gas: 9 slm
Exposing time to $NH_3$ gas: 18 seconds By adjusting process conditions based on the above-listed standard process conditions, it was tried to form a silicon carbonitride (SiCN) film having 16 atom % of carbon.

By changing the exposing time to $C_3H_6$ gas from 8 seconds to 16 seconds in the second step, a SiCN film having a high carbon content could be formed. That is, by increasing the exposing time to $C_3H_6$ gas longer than that of the standard process conditions in the second step, a SiCN film having a high carbon content could be formed. As the content of carbon was increased, the content of nitrogen was decreased. Except for the exposing time to $C_3H_6$ gas in the second step, other process conditions were set equal to the standard process conditions. That is, the process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 133 Pa (1 Torr)
Flowrate of $C_3H_6$ gas: 1 slm
Exposing time to $C_3H_6$ gas: 16 seconds
(Third Step)
Temperature in process chamber: 630° C.
Pressure in process chamber: 931 Pa (7 Torr)
Flowrate of $NH_3$ gas: 9 slm
Exposing time to $NH_3$ gas: 18 seconds Alternatively, by changing the pressure inside the process chamber from 133 Pa (1 Torr) to 266 Pa (2 Torr) in the second step, a SiCN film having a high carbon content could be formed. That is, by increasing the pressure inside the process chamber higher than that of the standard process conditions in the second step, a SiCN film having a high carbon content could be formed. As the content of carbon was increased, the content of nitrogen was decreased. Except for the pressure inside the process chamber in the second step, other process conditions were set equal to the standard process conditions. That is, the process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 266 Pa (2 Torr)
Flowrate of $C_3H_6$ gas: 1 slm
Exposing time to $C_3H_6$ gas: 8 seconds
(Third Step)
Temperature in process chamber: 630° C.
Pressure in process chamber: 931 Pa (7 Torr)
Flowrate of $NH_3$ gas: 9 slm
Exposing time to $NH_3$ gas: 18 seconds Alternatively, by changing the exposing time to $NH_3$ gas from 18 seconds to 6 seconds in the third step, a SiCN film having a relatively high carbon content could be formed because the content of nitrogen was reduced. That is, by decreasing the exposing time to $NH_3$ gas shorter than that of the standard process conditions in the third step, a SiCN film having a high carbon content could be formed. Except for the exposing time to $NH_3$, other process conditions were set equal to the standard process conditions. That is, the process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 133 Pa (1 Torr)
Flowrate of $C_3H_6$ gas: 1 slm
Exposing time to $C_3H_6$ gas: 8 seconds
(Third Step)
Temperature in process chamber: 630° C.
Pressure in process chamber: 931 Pa (7 Torr)
Flowrate of $NH_3$ gas: 9 slm
Exposing time to $NH_3$ gas: 6 seconds Alternatively, by changing the pressure inside the process chamber from 931 Pa (7 Torr) to 266 Pa (2 Torr) in the third step, similarly, a SiCN film having a high carbon content could be formed. That is, by decreasing the pressure inside the process chamber lower than that of the standard process conditions in the third step, a SiCN film having a high silicon content could be formed. Except for the pressure inside the process chamber, other process conditions were set equal to the standard process conditions. That is, the process conditions were set as follows.

(First Step)
Temperature in process chamber: 630° C.
Pressure in process chamber: 133 Pa (1 Torr)
Flowrate of DCS gas: 1 slm
Exposing time to DCS gas: 12 seconds
(Second Step)
Temperature in process chamber: 630° C.
Pressure in process chamber: 133 Pa (1 Torr)
Flowrate of $C_3H_6$ gas: 1 slm
Exposing time to $C_3H_6$ gas: 8 seconds
(Third Step)
Temperature in process chamber: 630° C.
Pressure in process chamber: 266 Pa (2 Torr)
Flowrate of $NH_3$ gas: 9 slm
Exposing time to $NH_3$ gas: 18 seconds By changing the C/N composition ratio of a silicon carbonitride film as described in the example, the etch resistance (film property) of the silicon carbonitride film can be improved, and thus the silicon carbonitride film can be used as an etch stopper film.

In the case of forming silicon oxynitride (SiON) film while controlling the composition ratio of the silicon oxynitride film according to the second sequence of the embodiment by using silicon (Si) as a first element, oxygen (O) as a second element, and nitrogen (N) as a third element, the O/N composition ratio of the silicon oxynitride film can be varied so as to reduce the dielectric constant of the silicon oxynitride film lower than that of a $Si_3N_4$ film and improve the etch resistance of the silicon oxynitride film superior that of a $SiO_2$ film for use in a variety of fields.

According to the present invention, there are provided a method of manufacturing a semiconductor device and a substrate processing apparatus, which are designed to modify a conventional film so as to improve the quality of the film for achieving a desired performance level of a semiconductor device.

(Supplementary Note)
The present invention also includes the following embodiments.

(Supplementary Note 1)
According to an embodiment of the present invention, there is provided a method of manufacturing a semiconductor device, the method including:

forming a first layer including a first element on a substrate by supplying a gas containing the first element to an inside of a process vessel in which the substrate is accommodated under a condition where a chemical vapor deposition (CVD) reaction is caused;

forming a second layer including the first element and a second element by supplying a gas containing the second element to the inside of the process vessel to modify the first layer; and forming a thin film including the first and second elements and having a predetermined thickness by setting the forming of the first layer and the forming of the second layer to one cycle and repeating the cycle at least once, wherein pressure of the inside of the process vessel, or pressure of the inside of the process vessel and a time of supplying the gas in one process of the forming of the first layer and the forming of the second layer are controlled to be higher or longer than pressure of the inside of the process vessel, or pressure of the inside of the process vessel and a time of supplying the gas in the one process when the thin film having a stoichiometric composition is formed, or pressure of the inside of the process vessel, or pressure of the inside of the process vessel and a time of supplying the gas in the other process of the forming of the first layer and the forming of the second layer are controlled to be lower or shorter than pressure of the inside of the process vessel, or pressure of the inside of the process vessel and a time of supplying the gas in the other process when the thin film having the stoichiometric composition is formed, so as to form the thin film having a composition that one of the first and second elements of the thin film is excessive as compared with the other in terms of the stoichiometric composition.

(Supplementary Note 2)
According to another embodiment of the present invention, there is provided a method of manufacturing a semiconductor device, the method including:

forming a first layer including a first element on a substrate by supplying a gas containing the first element to an inside of a process vessel in which the substrate is accommodated under a condition where a CVD reaction is caused;

forming a second layer including the first element and a second element by supplying a gas containing the second element to the inside of the process vessel, wherein the second layer is formed by forming a layer including the second element on the first layer, or the second layer is formed by modifying the first layer;

forming a third layer including the first element, the second element, and a third element by supplying a gas containing the third element to the inside of the process vessel to modify the second layer; and forming a thin film including the first to third elements and having a predetermined thickness by setting the forming of the first layer, the forming of the second layer, and the forming of the third layer to one cycle and repeating the cycle at least once, wherein pressure of the inside of the process vessel, or pressure of the inside of the process vessel and a time of supplying the gas in one process of the forming of the first layer, the forming of the second layer, and the forming of the third layer are controlled to be higher or longer than pressure of the inside of the process vessel, or pressure of the inside of the process vessel and a time of supplying the gas in the one process when the thin film having a stoichiometric composition is formed, or pressure of the inside of the process vessel, or pressure of the inside of the process vessel and a time of supplying the gas in the other process of the forming of the first layer, the forming of the second layer, and the forming of the third layer are controlled to be lower or shorter than pressure of the inside of the process vessel, or pressure of the inside of the process vessel and a time of supplying the gas in the other process when the thin film having the stoichiometric composition is formed, so as to form the thin film having a composition that one of the first to third elements of the thin film is excessive as compared with the others in terms of the stoichiometric composition.

(Supplementary Note 3)
According to another embodiment of the present invention, there is provided a method of manufacturing a semiconductor device, the method including:

forming a first layer including a first element on a substrate by supplying a gas containing the first element to an inside of a process vessel in which the substrate is accommodated under a condition where a CVD reaction is caused;

forming a second layer including the first element and a second element by supplying a gas containing the second element to the inside of the process vessel, wherein the second layer is formed by forming a layer including the second element on the first layer, or the second layer is formed by modifying the first layer, forming a third layer including the first element, the second element, and a third element by supplying a gas containing the third element to the inside of the process vessel, wherein the third layer is formed by forming a layer including the third element on the second layer, or the third layer is formed by modifying the second layer;

forming a fourth layer including the first to third elements and a fourth element by supplying a gas containing the fourth element to the inside of the process vessel to modify the third layer; and forming a thin film including the first to fourth elements and having a predetermined thickness by setting the forming of the first layer, the forming of the second layer, the forming of the third layer, and the forming of the fourth layer to one cycle and repeating the cycle at least once, wherein pressure of the inside of the process vessel, or pressure of the inside of the process vessel and a time of supplying the gas in one process of the forming of the first layer, the forming of the second layer, the forming of the third layer, and the forming of the fourth layer are controlled to be higher or longer than pressure of the inside of the process vessel, or pressure of the inside of the process vessel or a time of supplying the gas in the one process when the thin film having a stoichiometric composition is formed, or pressure of the inside of the process vessel, or pressure of the inside of the process vessel and a time of supplying the gas in the other process of the forming of the first layer, the forming of the second layer, the forming of the third layer, and the forming of the fourth layer are controlled to be lower or shorter than pressure of the inside of the process vessel, or pressure of the inside of the process vessel and a time of supplying the gas in the other process when the film having the stoichiometric composition is formed, so as to form the thin film having a composition that one of the first to fourth elements of the thin film is excessive as compared with the others in terms of the stoichiometric composition.

(Supplementary Note 4)

According to another embodiment of the present invention, there is provided a substrate processing apparatus including:

a process vessel configured to accommodate a substrate;

a first element-containing gas supply system configured to supply a gas containing a first element to an inside of the process vessel;

a second element-containing gas supply system configured to supply a gas containing a second element to the inside of the process vessel;

a pressure regulating unit configured to control pressure of the inside of the process vessel; and a controller, wherein the controller is configured to control the pressure regulating unit, the first element-containing gas supply system, and the second element-containing gas supply system so as to:

form a first layer including the first element on the substrate by supplying the gas containing the first element to the inside of the process vessel in which the substrate is accommodated under a condition where a CVD reaction is caused;

form a second layer including the first element and the second element by supplying the gas containing the second element to the inside of the process vessel to modify the first layer; and form a thin film including the first and second elements and having a predetermined thickness by setting the forming of the first layer and the forming of the second layer to one cycle and repeating the cycle at least once, wherein pressure of the inside of the process vessel, or pressure of the inside of the process vessel and a time of supplying the gas in one process of the forming of the first layer and the forming of the second layer are controlled to be higher or longer than pressure of the inside of the process vessel, or pressure of the inside of the process vessel and a time of supplying the gas in the one process when the thin film having a stoichiometric composition is formed, or pressure of the inside of the process vessel, or pressure of the inside of the process vessel and a time of supplying the gas in the other process of the forming of the first layer and the forming of the second layer are controlled to be lower or shorter than pressure of the inside of the process vessel, or pressure of the inside of the process vessel and a time of supplying the gas in the other process when the thin film having the stoichiometric composition is formed, so as to form the thin film having a composition that one of the first and second elements of the thin film is excessive as compared with the other in terms of the stoichiometric composition.

(Supplementary Note 5)

According to another embodiment of the present invention, there is provided a substrate processing apparatus including:

a process vessel configured to accommodate a substrate;

a first element-containing gas supply system configured to supply a gas containing a first element to an inside of the process vessel;

a second element-containing gas supply system configured to supply a gas containing a second element to the inside of the process vessel;

a third element-containing gas supply system configured to supply a gas containing a third element to the inside of the process vessel;

a pressure regulating unit configured to control pressure of the inside of the process vessel; and a controller, wherein the controller is configured to control the pressure regulating unit, the first element-containing gas supply system, the second element-containing gas supply system, and the third element-containing gas supply system so as to:

form a first layer including the first element on the substrate by supplying the gas containing the first element to the inside of the process vessel in which the substrate is accommodated under a condition where CVD reaction is caused;

form a second layer including the first and second elements by supplying the gas containing the second element to the inside of the process vessel, wherein the second layer is formed by forming a layer including the second element on the first layer, or the second layer is formed by modifying the first layer;

form a third layer including the first element, the second element, and the third element by supplying the gas containing the third element to the inside of the process vessel to modify the second layer; and form a thin film including the first to third elements and having a predetermined thickness by setting the forming of the first layer, the forming of the second layer, and the forming of the third layer to one cycle and repeating the cycle at least once, wherein pressure of the inside of the process vessel, or pressure of the inside of the process vessel and a time of supplying the gas in one process of the forming of the first layer, the forming of the second layer, and the forming of the third layer are controlled to be higher or longer than pressure of the inside of the process vessel, or pressure of the inside of the process vessel and a time of supplying the gas in the one process when the thin film having a stoichiometric composition is formed, or pressure of the inside of the process vessel, or pressure of the inside of the process vessel and a time of supplying the gas in the other process of the forming of the first layer, the forming of the second layer, and the forming of the third layer are controlled to be lower or shorter than pressure of the inside of the process vessel, or pressure of the inside of the process vessel and a time of supplying the gas in the other process when the thin film having the stoichiometric composition is formed, so as to form the thin film having a composition that one of the first to third elements of the thin film is excessive as compared with the others in terms of the stoichiometric composition.

(Supplementary Note 6)

According to another embodiment of the present invention, there is provided a substrate processing apparatus including:

a process vessel configured to accommodate a substrate;

a first element-containing gas supply system configured to supply a gas containing a first element to an inside of the process vessel;

a second element-containing gas supply system configured to supply a gas containing a second element to the inside of the process vessel;

a third element-containing gas supply system configured to supply a gas containing a third element to the inside of the process vessel;

a fourth element-containing gas supply system configured to supply a gas containing a fourth element to the inside of the process vessel;

a pressure regulating unit configured to control pressure of the inside of the process vessel; and a controller, wherein the controller is configured to control the pressure regulating unit, the first element-containing gas supply system, the second element-containing gas supply system, the third element-containing gas supply system, and the fourth element-containing gas supply system so as to:

form a first layer including the first element on the substrate by supplying the gas containing the first element to the inside of the process vessel in which the substrate is accommodated under a condition where a CVD reaction is caused;

form a second layer including the first and second elements by supplying the gas containing the second element to the inside of the process vessel, wherein the second layer is formed by forming a layer including the second element on the first layer, or the second layer is formed by modifying the first layer;

form a third layer including the first to third elements by supplying the gas containing the third element to the inside of the process vessel, wherein the third layer is formed by forming a layer including the third element on the second layer, or the third layer is formed by modifying the second layer;

form a fourth layer including the first to fourth elements by supplying the gas containing the fourth element to the inside of the process vessel to modify the third layer; and form a thin film including the first to fourth elements and having a predetermined thickness by setting the forming of the first layer, the forming of the second layer, the forming of the third layer, and the forming of the fourth layer to one cycle and repeating the cycle at least once, wherein pressure of the inside of the process vessel, or pressure of the inside of the process vessel and a time of supplying the gas in one process of the forming of the first layer, the forming of the second layer, the forming of the third layer, and the forming of the fourth layer are controlled to be higher or longer than pressure of the inside of the process vessel, or pressure of the inside of the process vessel and a time of supplying the gas in the one process when the thin film having a stoichiometric composition is formed, or pressure of the inside of the process vessel, or pressure of the inside of the process vessel and a time of supplying the gas in the other process of the forming of the first layer, the forming of the second layer, the forming of the third layer, and the forming of the fourth layer are controlled to be lower or shorter than pressure of the inside of the process vessel, or pressure of the inside of the process vessel and a time of supplying the gas in the other process when the thin film having the stoichiometric composition is formed, so as to form the thin film having a composition that one of the first to fourth elements of the thin film is excessive as compared with the others in terms of the stoichiometric composition.

What is claimed is:

1. A method of manufacturing a semiconductor device, comprising:
    forming a film on a substrate, the film including a first element and a second element different from the first element, by performing a cycle a predetermined number of times, the cycle including:
    (a) forming a first layer that includes the first element by supplying a first gas that includes the first element to the substrate; and
    (b) forming a second layer that includes the first element and the second element by supplying a second gas that includes the second element to the substrate to modify the first layer under a condition that a modifying reaction of the first layer by the second gas is not saturated.

2. The method of claim 1, wherein the first layer is not entirely modified in (b).

3. The method of claim 1, wherein a portion of the first layer is modified in (b).

4. The method of claim 1, wherein a portion of the first layer is modified and the other portion of the first layer is not modified in (b).

5. The method of claim 1, wherein a state where a portion of the first layer is exposed is maintained in (b).

6. The method of claim 1, wherein a composition ratio of the film is controlled by the condition in (b).

7. A method of manufacturing a semiconductor device, comprising:
    forming a film on a substrate, the film including a first element, a second element different from the first element, and a third element different from the first and the second elements, by performing a cycle a predetermined number of times, the cycle including:
    (a) forming a first layer that includes the first element by supplying a first gas that includes the first element to the substrate;
    (b) forming a second layer that includes the first element and the second element by supplying a second gas that includes the second element to the substrate to form a layer that includes the second element on the first layer or to modify the first layer; and (c) forming a third layer that includes the first element, the second element, and the third element by supplying a third gas that includes the third element to the substrate to modify the second layer under a condition that a modifying reaction of the second layer by the third gas is not saturated.

8. The method of claim 7, wherein the second layer is not entirely modified in (c).

9. The method of claim 7, wherein a portion of the second layer is modified in (c).

10. The method of claim 7, wherein a portion of the second layer is modified and the other portion of the second layer is not modified in (c).

11. The method of claim 7, wherein a state where a portion of the second layer is exposed is maintained in (c).

12. The method of claim 7, wherein a composition ratio of the film is controlled by the condition in (c).

13. A method of manufacturing a semiconductor device, comprising:
   forming a film on a substrate, the film including a first element, a second element different from the first element, a third element different from the second element, and a fourth element different from the first and the third elements, by performing a cycle a predetermined number of times, the cycle including:
   (a) forming a first layer that includes the first element by supplying a first gas that includes the first element to the substrate;
   (b) forming a second layer that includes the first element and the second element by supplying a second gas that includes the second element to the substrate to form a layer that includes the second element on the first layer or to modify the first layer;
   (c) forming a third layer that includes the first element, the second element, and the third element by supplying a third gas that includes the third element to the substrate to form a layer that includes the third element on the second layer or to modify the second layer; and
   (d) forming a fourth layer that includes the first element, the second element, the third element, and the fourth element by supplying a fourth gas that includes the fourth element to the substrate to modify the third layer under a condition that a modifying reaction of the third layer by the fourth gas is not saturated.

14. The method of claim 13, wherein the third layer is not entirely modified in (d).

15. The method of claim 13, wherein a portion of the third layer is modified in (d).

16. The method of claim 13, wherein a portion of the third layer is modified and the other portion of the third layer is not modified in (d).

17. The method of claim 13, wherein a state where a portion of the third layer is exposed is maintained in (d).

18. The method of claim 13, wherein a composition ratio of the film is controlled by the condition in (d).

* * * * *